United States Patent
Ridgeway et al.

(10) Patent No.: US 11,309,667 B2
(45) Date of Patent: Apr. 19, 2022

(54) SHALLOW ELECTRICAL PROTECTION DEVICE (GFCI, AFCI, AND AFCI/GFCI) SYSTEM AND METHOD

(71) Applicant: Hubbell Incorporated, Shelton, CT (US)

(72) Inventors: David Ridgeway, Milford, CT (US); Kenny Padro, Hamden, CT (US)

(73) Assignee: Hubbell Incorporated, Shelton, CT (US)

( * ) Notice: Subject to any disclaimer, the term of this patent is extended or adjusted under 35 U.S.C. 154(b) by 531 days.

(21) Appl. No.: 16/212,141

(22) Filed: Dec. 6, 2018

(65) Prior Publication Data
US 2019/0181594 A1 Jun. 13, 2019

Related U.S. Application Data

(60) Provisional application No. 62/595,760, filed on Dec. 7, 2017.

(51) Int. Cl.
*H01R 13/713* (2006.01)
*H01R 13/71* (2006.01)
(Continued)

(52) U.S. Cl.
CPC ......... *H01R 13/7135* (2013.01); *G01R 11/04* (2013.01); *H01H 71/505* (2013.01);
(Continued)

(58) Field of Classification Search
CPC .. H01R 13/7135; H01R 13/71; H01R 13/713; H01R 24/78; H01R 25/006;
(Continued)

(56) References Cited

U.S. PATENT DOCUMENTS 4,549,241 A * 10/1985 Morris ............... H01H 83/04
361/115
8,830,015 B2 9/2014 Padro et al.
(Continued)

FOREIGN PATENT DOCUMENTS

CN 2439127 Y 7/2001
CN 1815664 A 8/2006
(Continued)

OTHER PUBLICATIONS

PCT/US2018/064269 International Search Report and Written Opinion dated Apr. 25, 2019 (13 pages).
(Continued)

*Primary Examiner* — Dharti H Patel
(74) *Attorney, Agent, or Firm* — Michael Best & Friedrich LLP

(57) ABSTRACT

A resettable switching apparatus, useful in a GFCI receptacle, has a housing with a face plate and at least one sense transformer core positioned to define a current flow direction through a center cavity that is parallel to the face plate. The GFCI receptacle further includes a space-efficient coaxial configuration in which a mechanical latching arrangement for resetting (i.e., closing) main switch contacts is disposed inside the trip solenoid. A movable carriage for the main contacts spans one end of the solenoid and has a latching portion in the solenoid that engages the inner end of a reset plunger in two sequential states (i.e., unlatched and latched). The mechanical latching arrangement comprises a cam surface coupled to a lifting plate, which is connected to the carriage of the GFCI receptacle. The cam surface is responsible for translating a downward movement to a translational movement to engage the carriage to the rest plunger.

14 Claims, 27 Drawing Sheets

(51) Int. Cl.
    *H01H 83/04*     (2006.01)
    *G01R 11/04*     (2006.01)
    *H01H 71/50*     (2006.01)
    *H01H 71/58*     (2006.01)
    *H01R 25/00*     (2006.01)
    *H01R 103/00*    (2006.01)
    *H01R 24/76*     (2011.01)
    *H01H 83/14*     (2006.01)
    *H01R 24/78*     (2011.01)

(52) U.S. Cl.
    CPC ............ *H01H 71/58* (2013.01); *H01H 83/04* (2013.01); *H01R 13/71* (2013.01); *H01H 83/144* (2013.01); *H01R 13/713* (2013.01); *H01R 24/76* (2013.01); *H01R 24/78* (2013.01); *H01R 25/006* (2013.01); *H01R 2103/00* (2013.01)

(58) Field of Classification Search
    CPC .... H01R 2103/00; H01R 24/76; H01H 83/04; H01H 71/505; H01H 71/58; H01H 83/144; G01R 11/04
    USPC .......................................................... 361/42
    See application file for complete search history.

(56) References Cited

U.S. PATENT DOCUMENTS

| | | | |
|---|---|---|---|
| 8,861,146 B2* | 10/2014 | McMahon | H02H 3/162 |
| | | | 361/42 |
| 9,774,181 B2* | 9/2017 | Bonasia | H01R 13/6616 |
| 2004/0218316 A1 | 11/2004 | Germain et al. | |
| 2009/0184787 A1 | 7/2009 | Weeks | |
| 2013/0241677 A1 | 9/2013 | Padro | |
| 2014/0322049 A1 | 10/2014 | Graybill | |
| 2015/0200533 A1* | 7/2015 | Simonin | H02H 3/05 |
| | | | 335/17 |

FOREIGN PATENT DOCUMENTS

| | | |
|---|---|---|
| CN | 101752152 A | 6/2010 |
| CN | 201541122 U | 8/2010 |
| CN | 202550296 U | 11/2012 |
| JP | H0785769 A | 3/1995 |
| WO | 2016085738 | 6/2016 |

OTHER PUBLICATIONS

Chinese Patent Application No. 20188081926.4 First Office Action issued by the China National Intellectual Property Administration (and translation) dated Jul. 7, 2021.

European Patent Application No. 18886862 extended European search report and European search opinion dated Jul. 19, 2021.

Chinese Patent Application No. 20188081926.4 Second Office Action issued by the China National Intellectual Property Administration (and translation) dated Dec. 3, 2021.

* cited by examiner

US 11,309,667 B2

SHALLOW ELECTRICAL PROTECTION DEVICE (GFCI, AFCI, AND AFCI/GFCI) SYSTEM AND METHOD

CROSS-REFERENCE TO RELATED APPLICATION(S)

This application claims priority to U.S. Provisional Patent Application No. 62/595,760, filed Dec. 7, 2017, the entire contents of which are expressly incorporated herein by reference.

This application contains subject matter related to subject matter contained in U.S. Pat. No. 8,830,015 B2 entitled, "COMPACT LATCHING MECHANISM FOR SWITCHED ELECTRICAL DEVICE," by Kenny Padro et al., which is assigned to the assignee hereof, and the entire contents of which are expressly incorporated herein by reference.

FIELD

Embodiments relate to switched electrical devices, more particularly to circuit interrupting devices.

SUMMARY

Circuit interrupting devices, such as ground fault circuit interrupter (GFCI) devices, switch to a "tripped" or unlatched state from a "reset" or latched state when one or more conditions is detected. GFCI devices having contacts that are biased toward the open position require a latching mechanism for setting and holding the contacts in a closed position. Likewise, switched electrical devices having contacts that are biased toward the closed position require a latching mechanism for setting and holding the contacts in an open position. Examples of conventional types of devices include devices of the circuit interrupting type, such as circuit breakers, arc fault interrupters, and GFCIs, to name a few.

Many electrical receptacles have built-in ground fault protection circuitry, i.e., GFCI receptacles. Such protection circuitry and the associated mechanisms normally take up a substantial amount of the physical space within a receptacle housing, the size of which is limited by the standard junction boxes in which they must fit. The embodiments disclosed in the present application attempt to solve these problems by providing more compact devices, allowing for shallower receptacles and more space for other elements and/or features.

One embodiment discloses an electrical outlet receptacle comprises a housing including a face plate and a plurality of sensing cores each configured to receive a current flow through a center cavity. The current flow defines a current flow direction through the center cavity, wherein the current flow direction is parallel to the face plate, and the plurality of sensing cores are placed symmetrically in a translational direction across the electrical outlet receptacle.

Another embodiment discloses an electrical outlet receptacle comprises a housing including a face plate and a sensing core configured to receive a current flow through a center cavity. The current flow defines a current flow direction through the center cavity of the sensing core, wherein the current flow direction is parallel to the face plate.

Another embodiment discloses an electrical outlet receptacle comprises a circuit board defining a first plane, a set of fixed contacts, a set of movable contacts, a solenoid having a central axis perpendicular to the first plane, a carriage movable axially along the solenoid and configured to interact with the set of movable contacts, a lifting shelf slidably coupled to a slot in the carriage and movable in a translational direction perpendicular to the central axis of the solenoid, a slide mechanism coupled to the lifting shelf and movable in the translational direction of the lifting shelf, a reset plunger with a portion extending through a first end of the solenoid and axially movable therein, and an armature movable axially along the portion of the reset plunger extending through the solenoid. The circuit board includes at least one contact pad. The solenoid includes a second end opposite the first end. The carriage is adapted to advance the set of movable contacts to form electrical communication with the set of fixed contacts during resetting of the electrical outlet receptacle. The lifting shelf includes a latching portion. The slide mechanism includes a cam surface to transform a downward force to a translational force applied to the coupled lifting shelf. The reset plunger includes an intermediate collar configured to engage to the latching portion of the lifting shelf. The armature includes a slanted projection configured to contact the cam surface of the slide mechanism and provide the downward force on the cam surface.

Other aspects of the application will become apparent by consideration of the detailed description and accompanying drawings.

BRIEF DESCRIPTION OF THE DRAWINGS

The aspects and features of various exemplary embodiments will be more apparent from the description of those exemplary embodiments taken with reference to the accompanying drawings, in which.

DETAILED DESCRIPTION OF EXEMPLARY EMBODIMENTS

Before any embodiments of the application are explained in detail, it is to be understood that the application is not limited in its application to the details of construction and the arrangement of components set forth in the following description or illustrated in the following drawings. The application is capable of other embodiments and of being practiced or carried out in various ways.

As described herein, terms such as "front," "rear," "side," "top," "bottom," "above," "below," "upwardly," and "downwardly" are intended to facilitate the description of the electrical receptacle of the application, and are not intended to limit the structure of the application to any particular position or orientation.

Exemplary embodiments of devices consistent with the present application include one or more of the novel mechanical and/or electrical features described in detail below. Such features may include a compactly positioned sensing core, a vertical solenoid, and a latching mechanism including a lifting shelf, a slide mechanism, an intermediate collar, and a cam surface. In some exemplary embodiments of the present application, multiple features listed above are incorporated into one element whereas in other exemplary embodiments, each feature is distinct from one another and coupled to interact with each other. The novel mechanical and/or electrical features detailed herein efficiently utilize the space within the device housing to provide more area for additional features and/or components.

Figure 1:
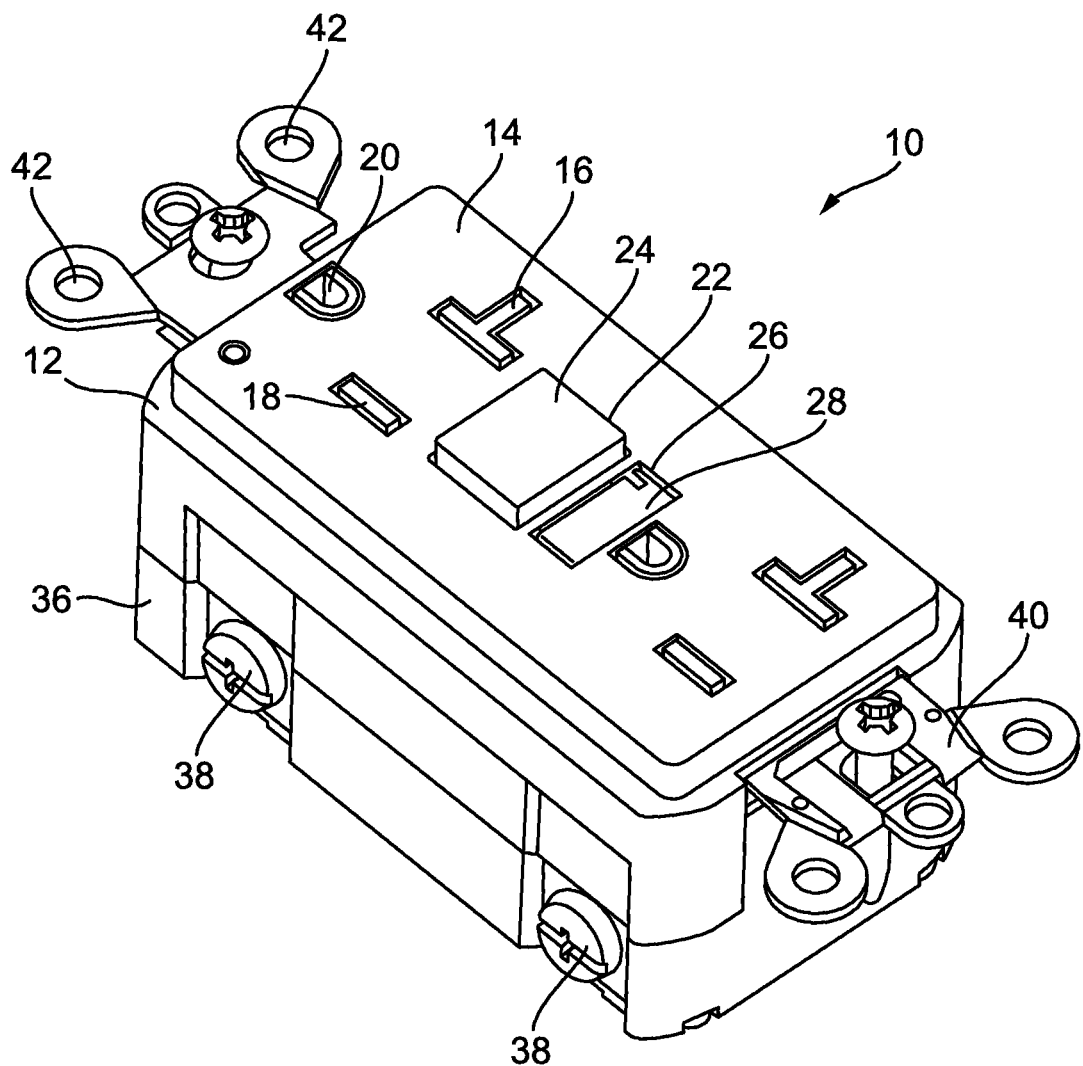
FIG. 1 is a front perspective view of a receptacle incorporating the resettable switching apparatus of the application.

FIG. 1 illustrates a perspective view of a GFCI receptacle 10 according to one embodiment of the application. The GFCI receptacle 10 includes a front cover 12 having an outlet face 14 with phase 16, neutral 18, and ground 20 openings. The outlet face 14 also has a central opening 22 for a reset button 24 adjacent to an opening 26 for a test button 28. Rear cover 36 is secured to front cover 12 by screws (not shown or enumerated). Screw terminals 38 mechanically and/or electrically couple wires when wiring the receptacle 10. A ground yoke/bridge assembly 40 includes standard mounting ears 42 that protrude from the ends of the receptacle 10.

Figure 2:
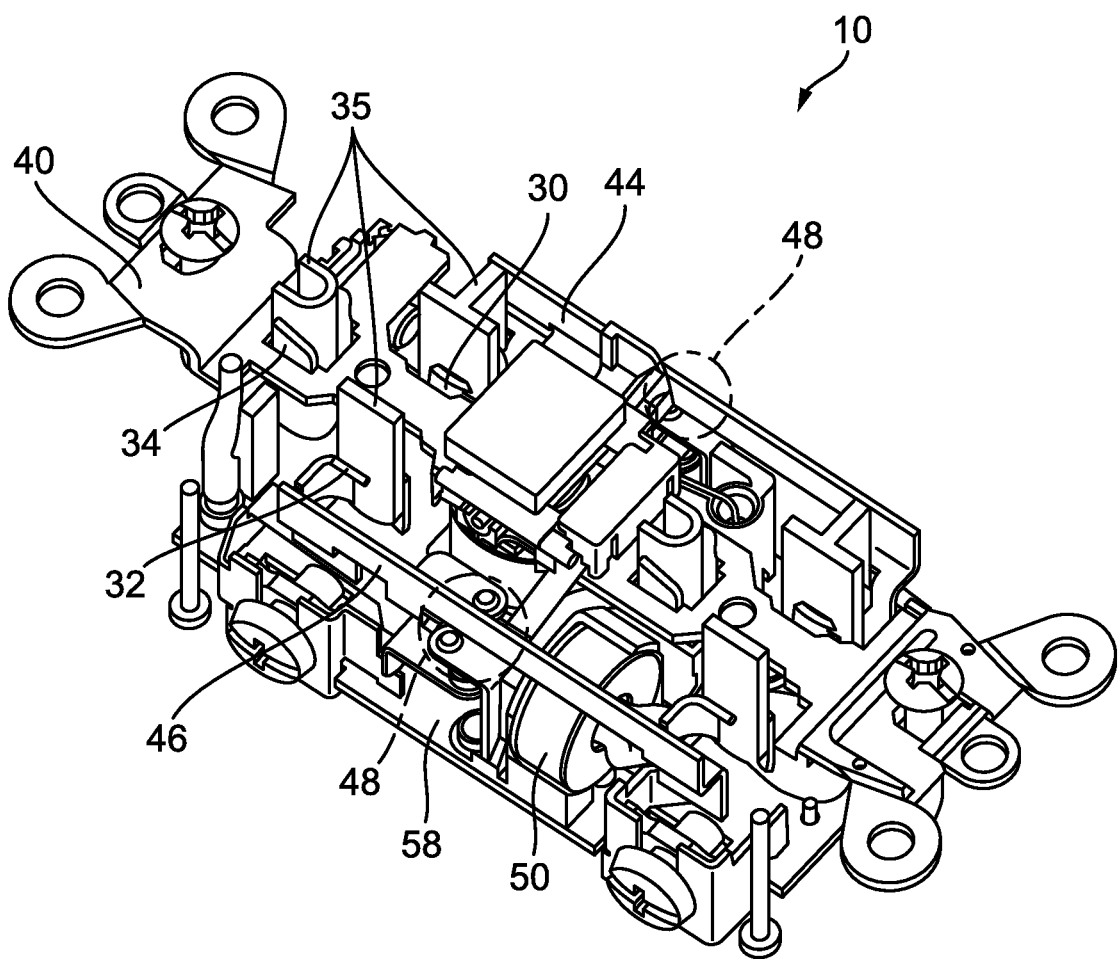
FIG. 2 is a front perspective view of the receptacle of FIG. 1, with the front and rear covers and tamper-resistant mechanisms removed.
Figure 3:
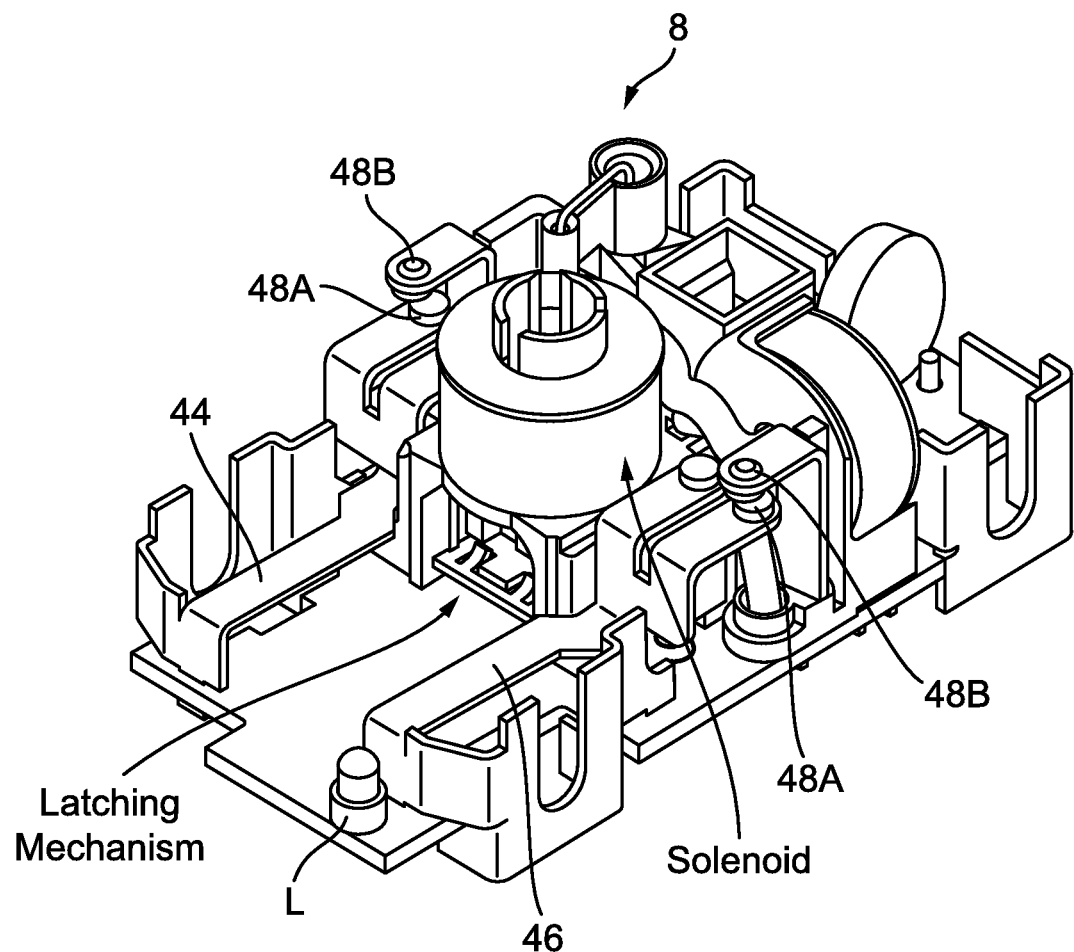
FIG. 3 is a front perspective view showing a configuration of a set of movable contacts and a set of fixed contacts according to one embodiment.

Referring to FIG. 2, the GFCI receptacle 10 with the front cover 12, rear cover 36, and tamper-resistant mechanisms (not enumerated) removed shows phase terminal 30, neutral terminal 32, ground terminal 34, and a circuit board 58. The phase, neutral, and ground terminals 30, 32, 34 are respectively configured to receive electrical plugs 35 of a connecting electrical device, such as a power cord. The circuit board 58 provides control and physical support for most of the working components of the receptacle 10. The phase and neutral terminals 30, 32 may be movable, supported and energized through bus bars 44, 46, respectively. Bus bars 44, 46 act as cantilevered arms that support a set of contacts 48. As shown in the embodiment of FIG. 3, the set of contacts 48 include a set of movable contacts 48A and a set of fixed contacts 48B. Bus bars 44, 46 respectively serve as cantilevered support for the set of movable contacts 48A while the set of fixed contacts 48B is supported by a carrier assembly 8. This configuration may be reversed or changed in other embodiments of the application not described in detail herein. In various embodiments, an indicator light L may be included in the GFCI receptacle 10 and configured to indicate the state of the GFCI receptacle 10.

The resiliency of the cantilevered support provided by the bus bars 44, 46 bias the set of movable contacts 48A away from the set of fixed contacts 48B. A latching mechanism including a movable carriage, described in further detail in the following figures, is used to engage with the set of movable contacts 48A, thereby pushing the set of movable contacts 48A in an upward direction to engage the set of fixed contacts 48B in a closed position during resetting of the GFCI receptacle 10. This upward movement of the set of movable contacts 48A also causes corresponding upward movement in the attached phase and neutral terminals 30, 32 closer to the front cover 12 of the receptacle 10. Electricity may then be delivered from an external power source to the receptacle openings 16, 18, 20. In other embodiments, the resiliency of the cantilevered bus bars 44, 46 may bias the set of movable contacts 48A toward the set of fixed contacts 48B, and a latching mechanism may be employed in reverse to engage and hold the set of movable contacts 48A away from the set of fixed contacts 48B in an open position during tripping of the GFCI receptacle 10. The phase and neutral terminals 30, 32 will likewise increase in distance from the front cover 12, thereby prohibiting the flow of electricity between the external power source and the receptacle openings 16, 18, 20. Various embodiments of the latching mechanism may be used by various application designs, the details of each are not disclosed in detail herein.

Figure 4A:
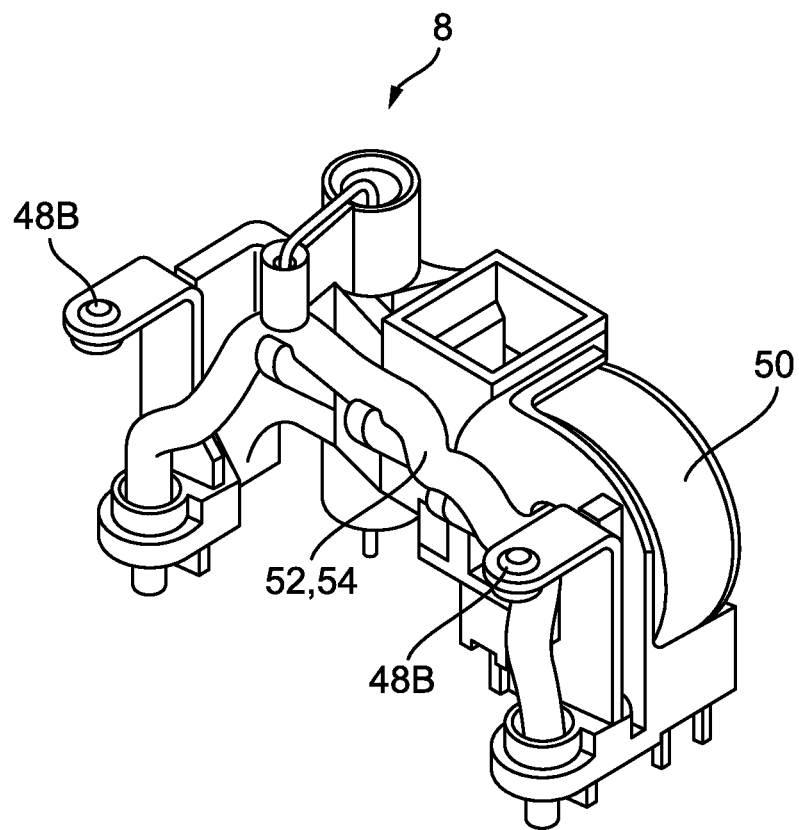
FIG. 4A is a front perspective view of the carrier assembly of the receptacle according to one embodiment.
Figure 4B:
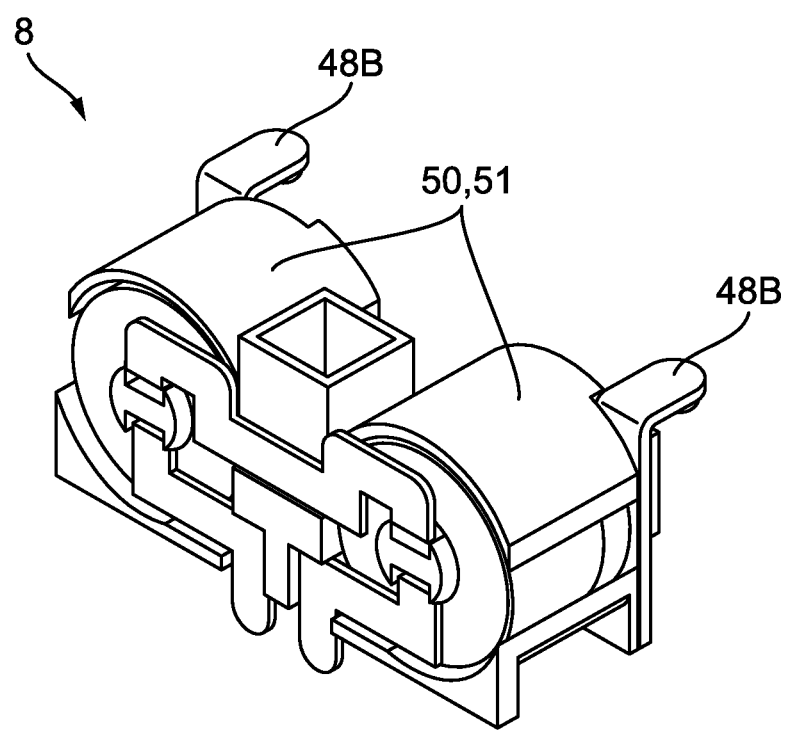
FIG. 4B is a front perspective view of the carrier assembly of the receptacle according to another embodiment.

Referring to FIG. 4A, in addition to providing structural support for the set of fixed contacts 48B, the carrier assembly 8 also provides structural support for a sense transformer core 50 and conductor windings 52, 54. In another embodiment shown in FIG. 4B, the carrier assembly 8 may provide structural support for multiple sets of sense transformer cores 50, 51, as described in further detail below. Various placements of sense transformer core(s) 50, 51 may be possible and will be further described in the following figures.

Figure 5A:
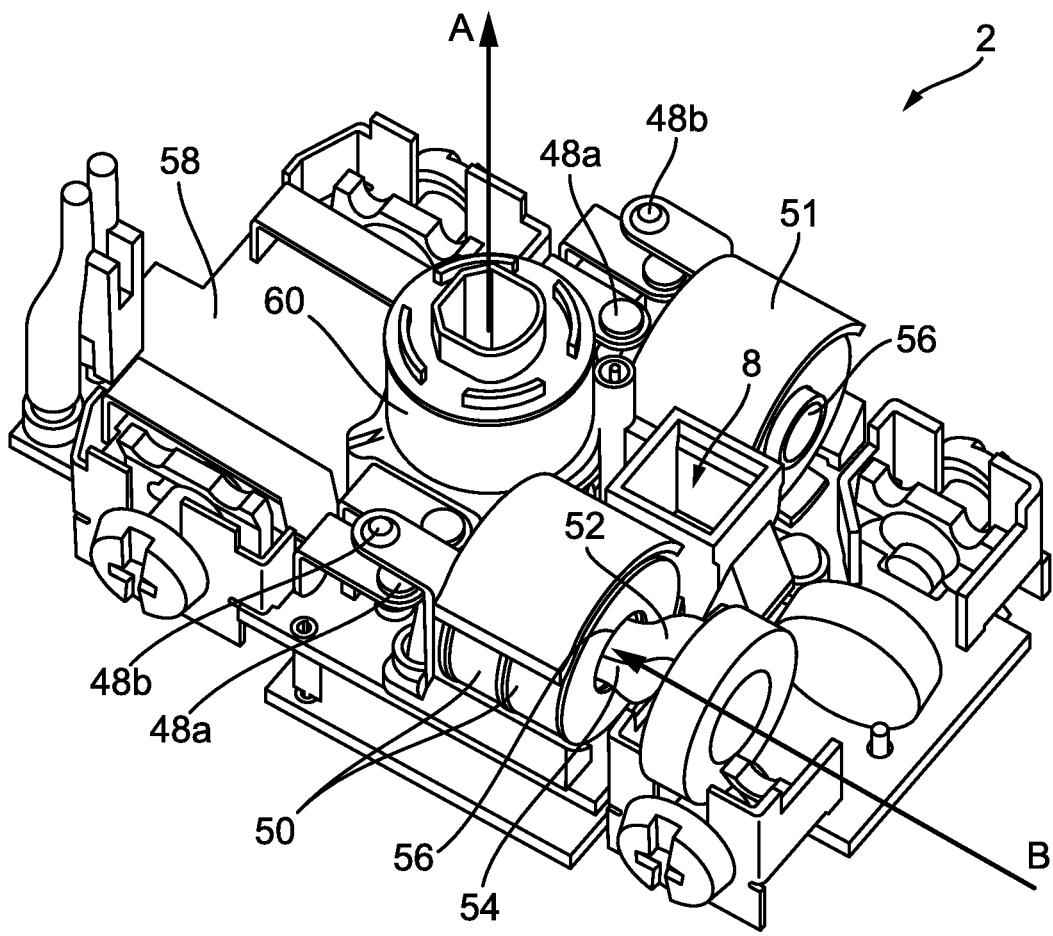
FIG. 5A is a front perspective view of the core assembly of the receptacle.

FIG. 5A illustrates a perspective view of a core assembly 2 of the GFCI receptacle 10 depicted in FIG. 1. A solenoid 60 is oriented to define a central axis A. Multiple sense transformer cores 50 may be stacked together and configured to receive a phase conductor winding 52 and a neutral conductor winding 54 through a common central cavity 56.

Figure 5B:
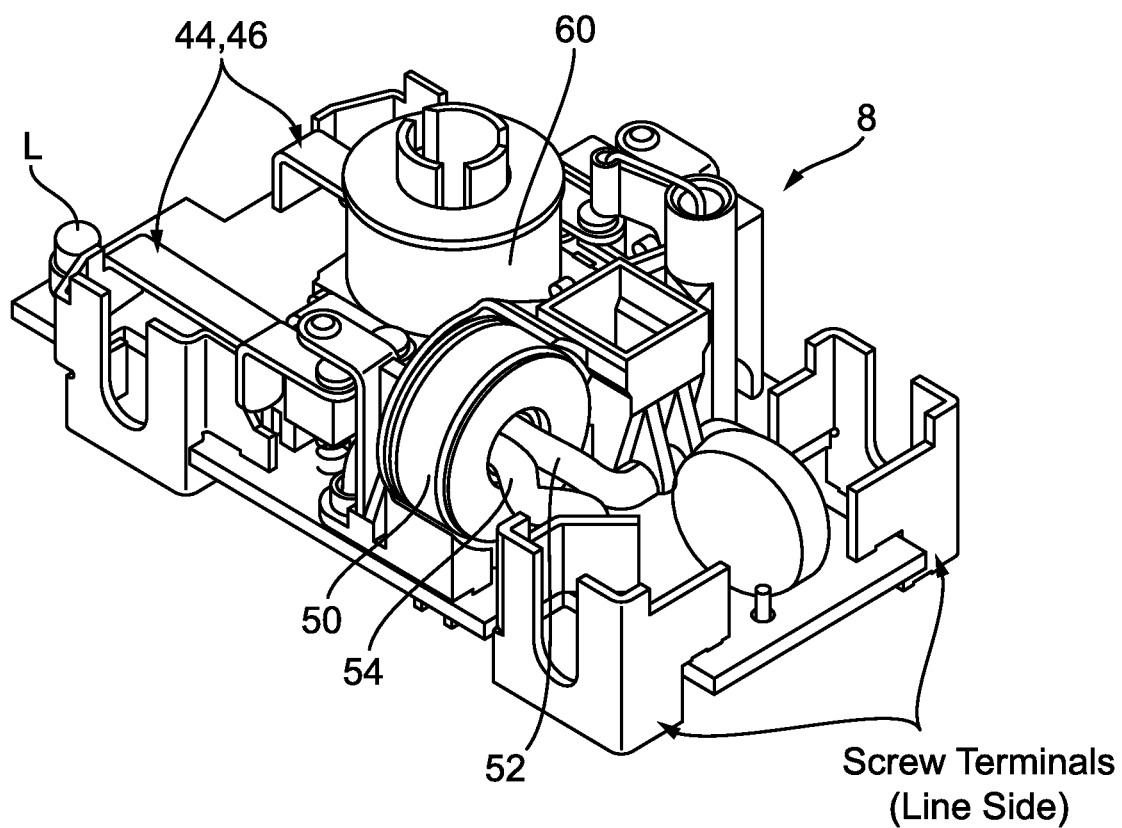
FIG. 5B is a front perspective view showing a configuration of a sense transformer core according to one embodiment.
Figure 5C:
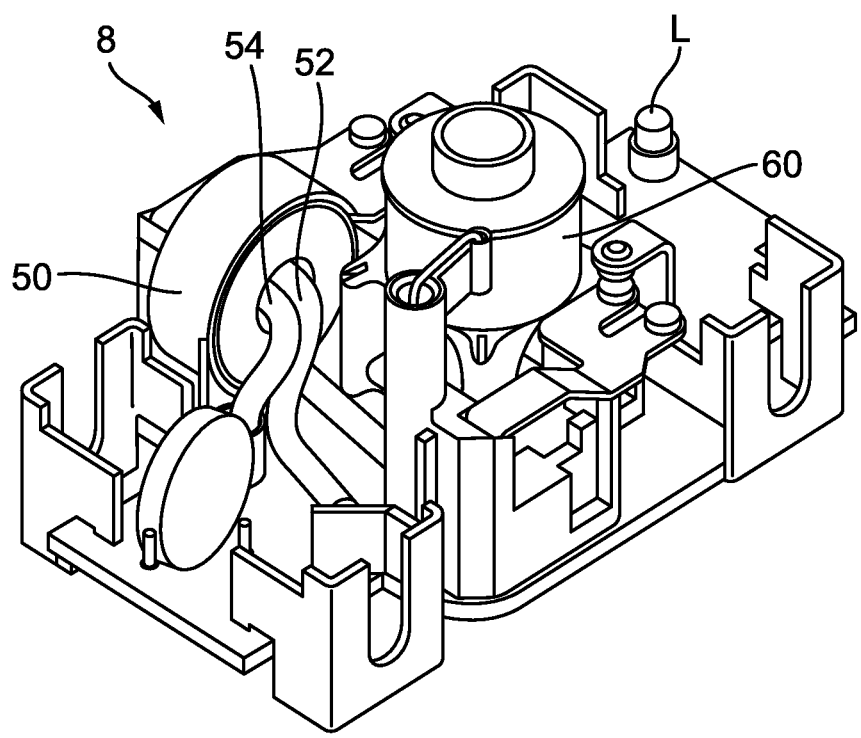
FIG. 5C is a front perspective view showing a configuration of a sense transformer core according to another embodiment.

Additional sets of stacked sense transformer cores 51 may be added to the carrier assembly 8 (see FIG. 4B) to provide further measurements, such as arc fault measurements, to the GFCI receptacle 10. The phase and neutral conductor windings 52, 54 respectively direct AC current from the phase and neutral terminals 30, 32 through the central cavity 56, where the current may be measured for potential ground faults or arc faults. The AC current flow through the central cavity 56 defines a direction B, which is perpendicular to the central axis A of the solenoid 60. In the embodiment of FIG. 5A, the two sets of sense transformer cores 50, 51 are placed symmetrically at two ends of the circuit board 58 with current flow directions parallel to each other. This symmetrical placement allows less or essentially no interference of the sense transformer cores 50, 51 with the phase, neutral, or ground openings 16, 18, 20, respectively. It would be appreciated by those skilled in the art that other positioning configurations of the sets of sense transformer cores may be possible and not exhaustively described herein. For example, the current flow directions defined by multiple sets of sense transformer cores 50, 51 may be at an angle to each other and both parallel to the circuit board 58. The angle defined by the current flow directions may be acute, right, or obtuse. In another example shown in FIGS. 5B-C, only one sense transformer core 50 may be included in the GFCI receptacle 10. The sense transformer core 50 may be placed at either ends of the circuit board 58 and with various orientations to allow less or essentially no interference with the phase, neutral, and ground openings 16, 18, 20.

Figure 6A:
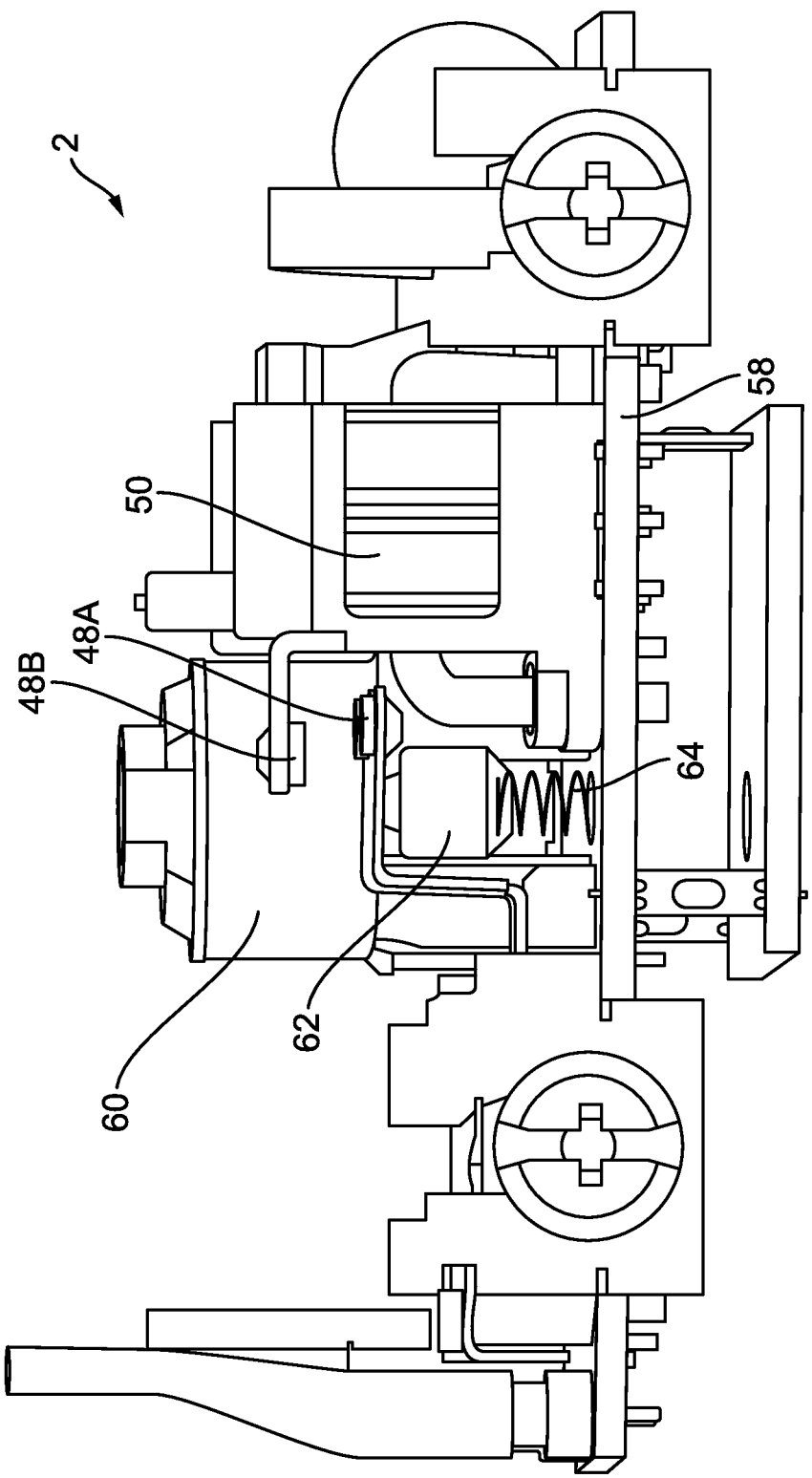
FIG. 6A is a side perspective view of the core assembly of the receptacle according to one embodiment.
Figure 6B:
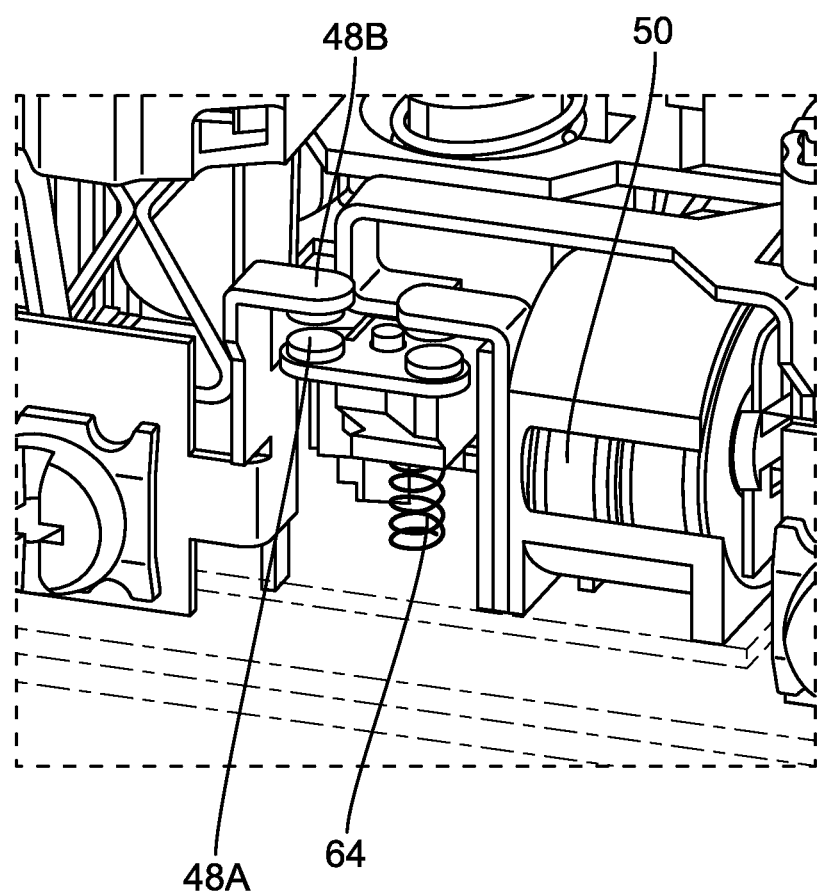
FIG. 6B is a side perspective view of the core assembly of the receptacle according to another embodiment.

Referring to FIGS. 6A-B, the solenoid 60 is coupled to a carriage 62 that is axially movable along the solenoid 60. On one side, the carriage 62 is coupled to a set of carriage springs 64, the compression force of which distances the carriage 62 from the circuit board 58 in a rest position. On the other side, the carriage 62 is configured to engage the set of movable contacts 48A, which presses down on the carriage 62 when in an unbiased resting position. During the resetting process of the GFCI receptacle 10, the carriage 62 will oppose the resiliency of the abutting set of movable contacts 48A to advance the set movable contacts 48A in an upward direction and form electrical communication with the set of fixed contacts 48B. The upward movement of the set of movable contacts 48A stops once electrical communication is formed with the set of fixed contacts 48B. During the tripping process of the GFCI receptacle 10, the resiliency of the abutting set of movable contacts 48A pushes the carriage 62 in a downward direction back to its original rest position, thereby effectively breaking the electrical connection between the set of movable contacts 48A and the set of fixed contacts 48B. The downward movement range of the set of movable contacts 48A is limited by a stopping plane in the solenoid support structure 61. Once the set of movable contacts 48A hits the stopping plane or returns to the unbiased resting position, push force is no longer exerted on the carriage 62, thereby effectively halting the downward movement and limiting the maximum range of movement of the carriage 62. Resetting and latching of the GFCI receptacle 10 may be controlled by the circuit board 58 that receives ground fault and arc fault signal inputs from the sense transformer cores 50, 51.

Figure 7:
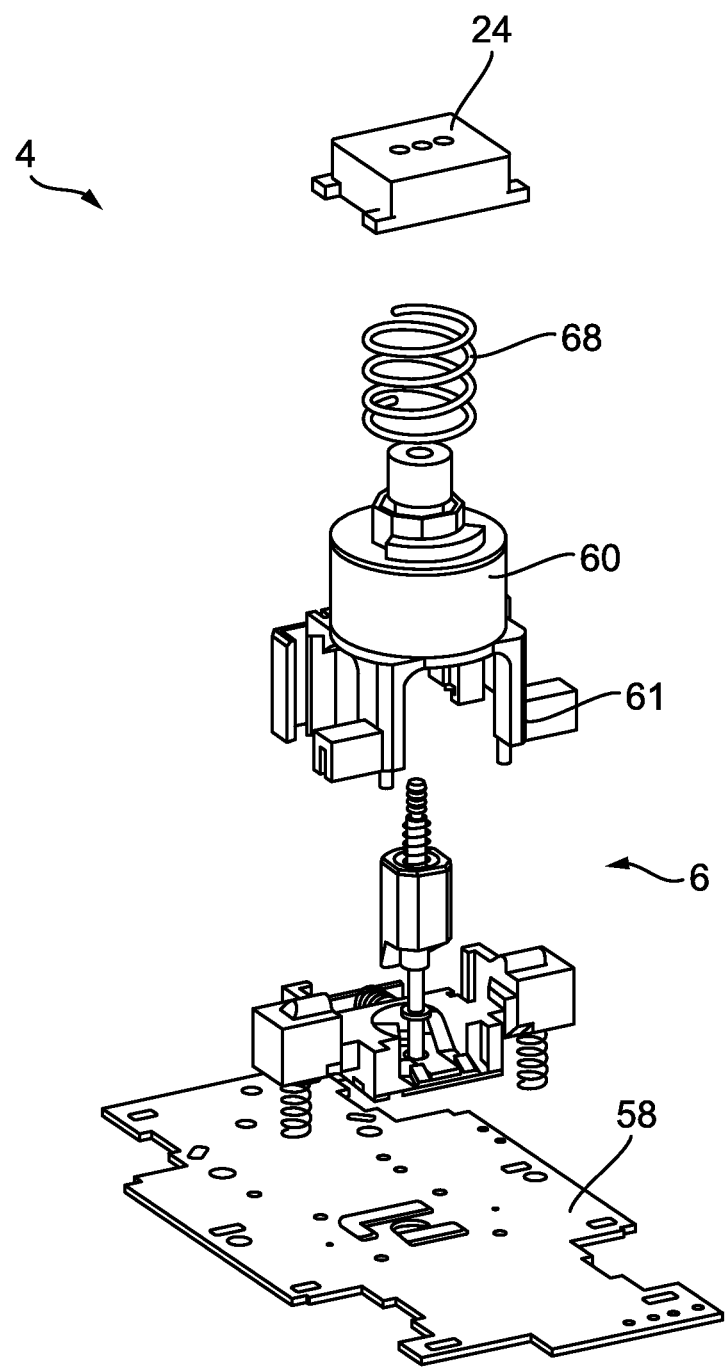
FIG. 7 is an exploded front perspective view of a solenoid assembly according to one embodiment.
Figure 8:
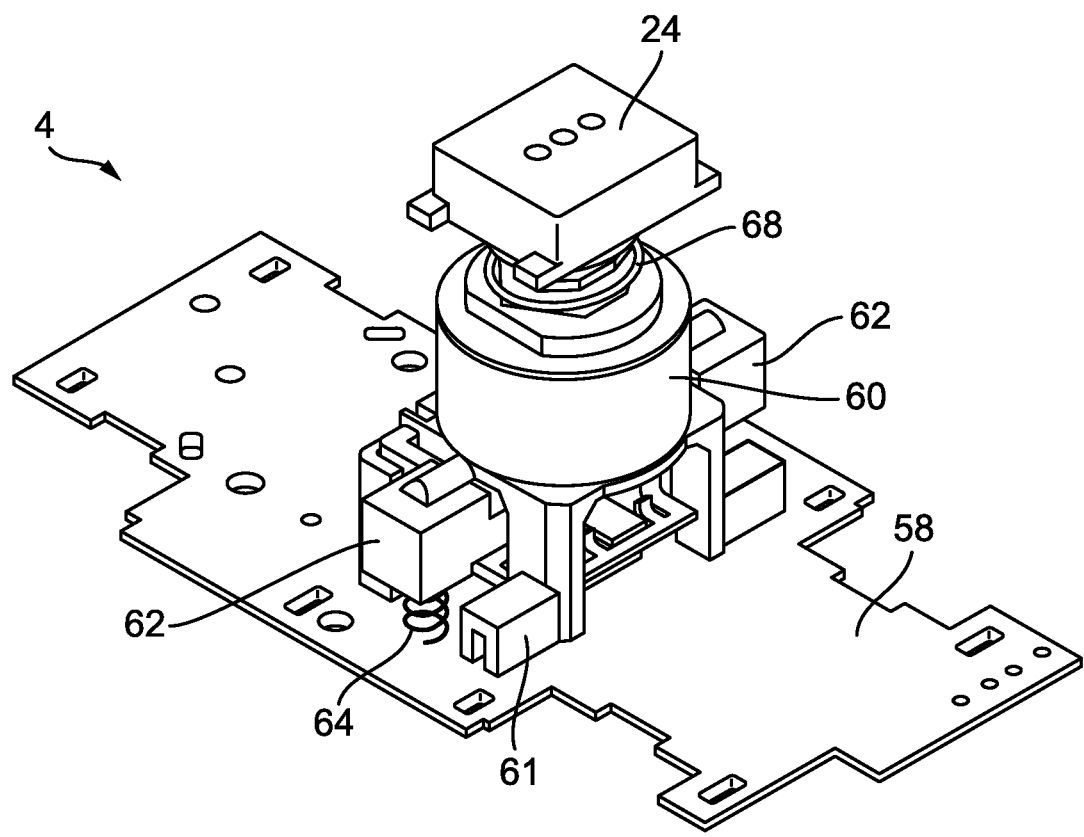
FIG. 8 is an assembled front perspective view of the solenoid assembly of FIG. 7.

FIG. 7 shows an exploded view of a solenoid assembly 4 of the GFCI receptacle 10 according to one embodiment of the present application. The solenoid assembly 4 includes a reset button 24, a reset spring 68, a solenoid 60, a reset plunger assembly 6, a solenoid support structure 61, and a circuit board 58. In some embodiments, the solenoid support structure 61 is coupled to the circuit board 58 and supports the solenoid 60. When assembled as shown in FIG. 8, the reset button 24 is biased away from the solenoid 60 via the reset spring 68 as long as no push force is exerted on the reset button 24. When a push force is exerted and subsequently released on the reset button 24, the compression force of the reset spring 68 returns the reset plunger 66 and the reset button 24 to an original resting position biased away from the solenoid support structure 61. Likewise, without an externally exerted downward force, the carriage 62 is biased away from the circuit board 58 via the set of carriage springs 64. The compression force of the carriage springs 64 returns the carriage 62 to an original position biased away from the circuit board 58 when external forces are removed.

Figure 9:
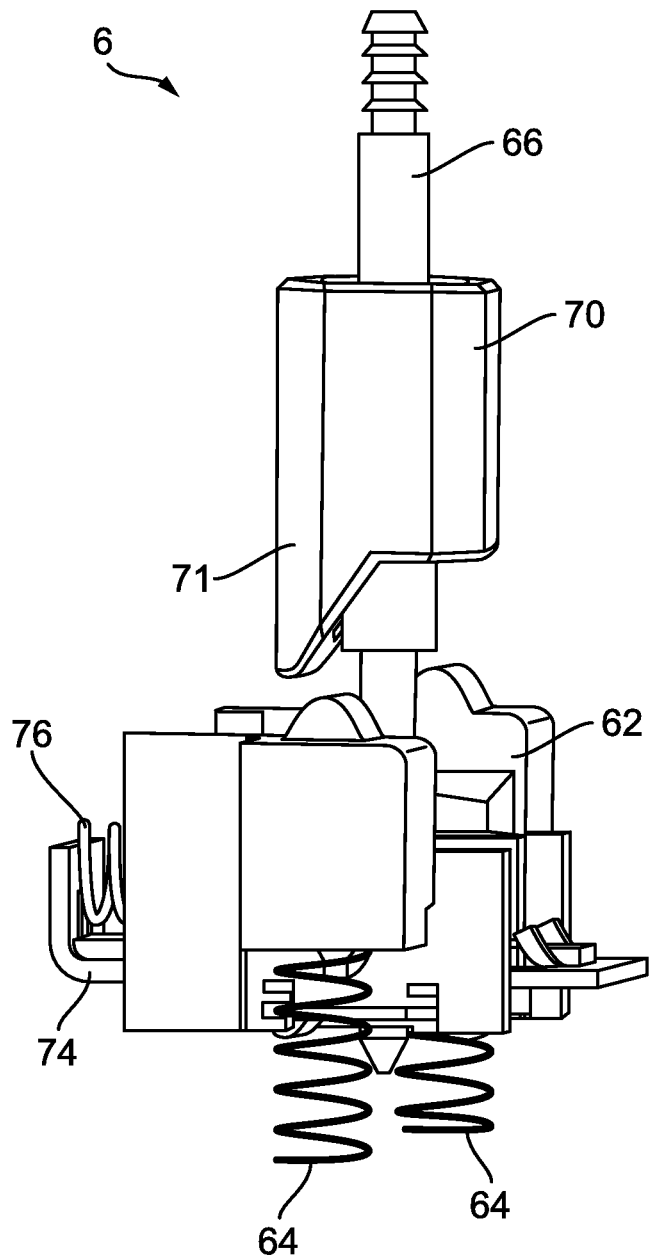
FIG. 9 is a side perspective view of the reset plunger assembly and carriage of the solenoid assembly according to one embodiment.
Figure 10:
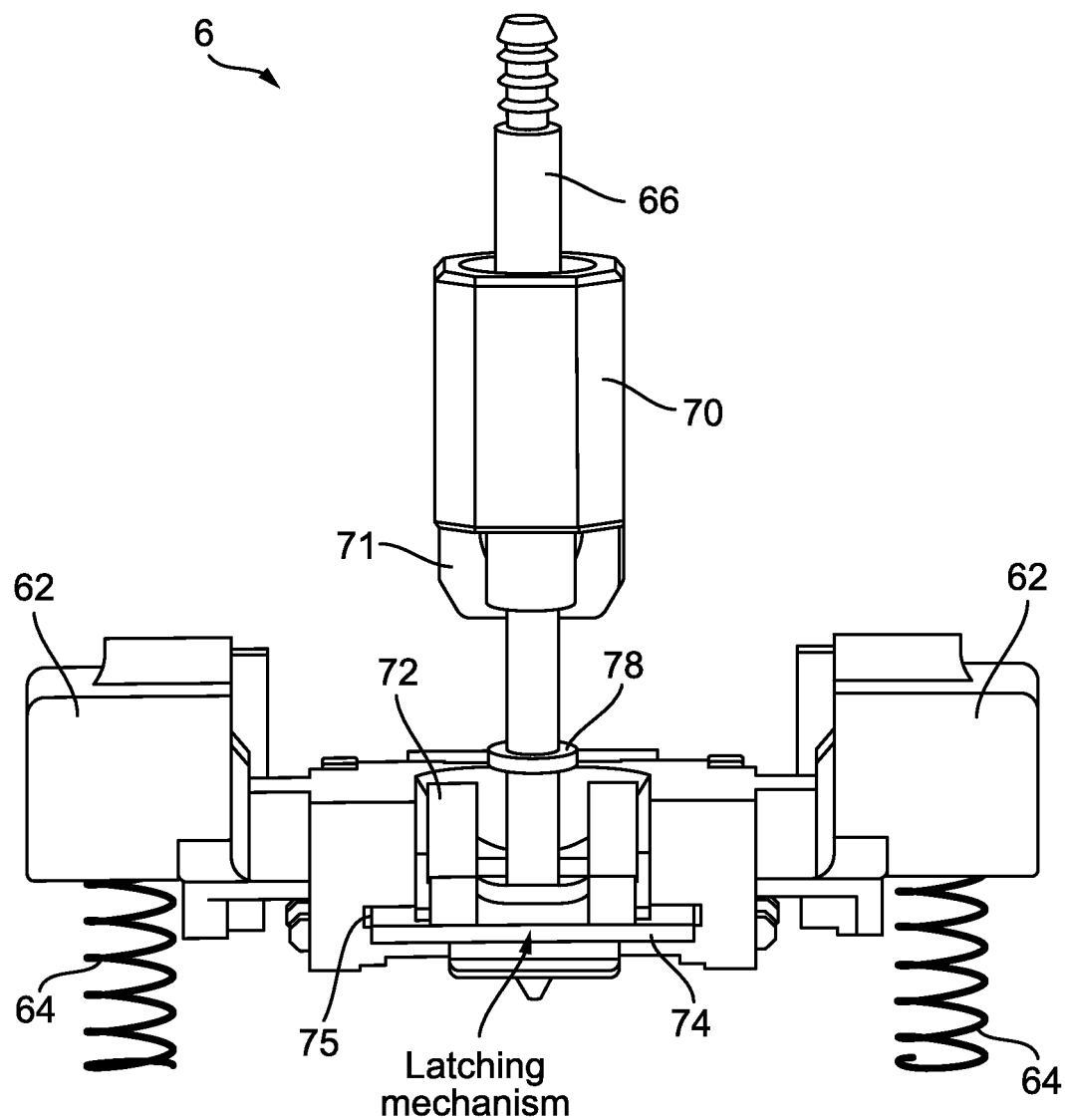
FIG. 10 is another side perspective view from a different angle of the reset plunger assembly and carriage similar to FIG. 9.
Figure 11:
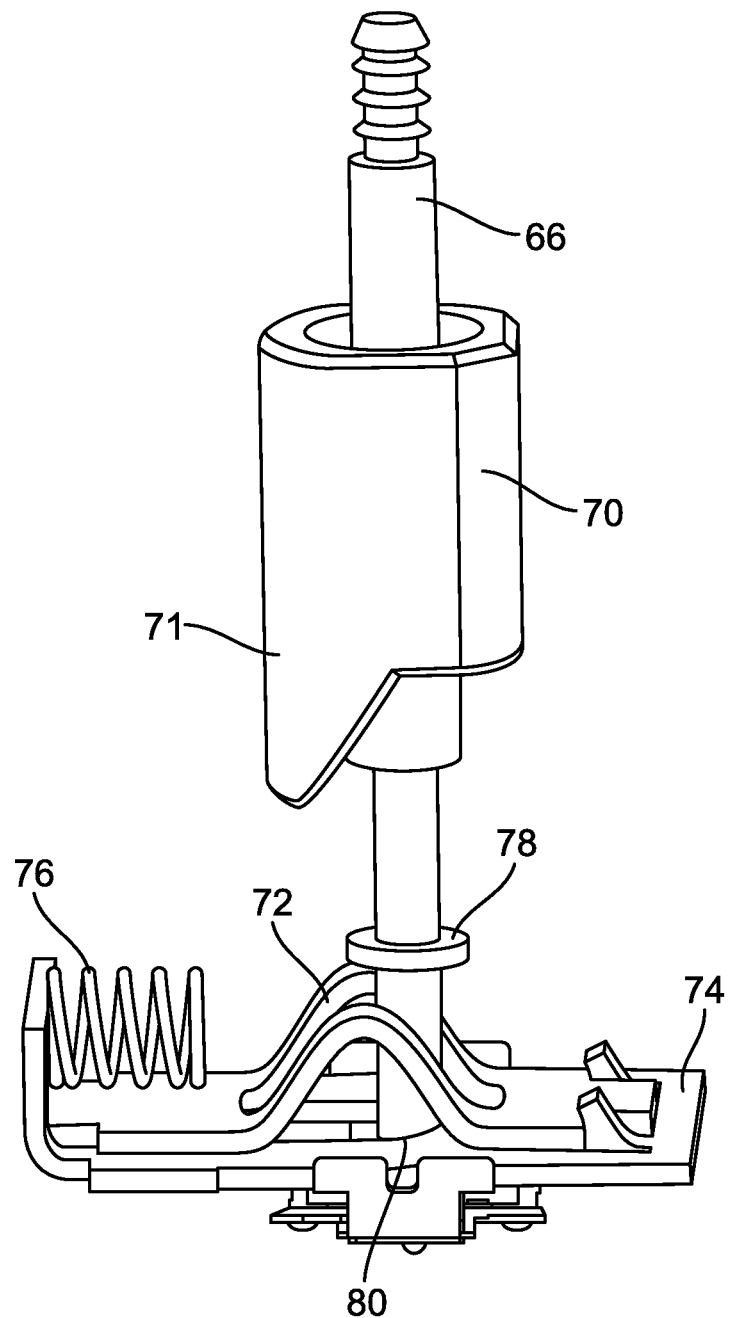
FIG. 11 is a side perspective view of the reset plunger assembly and latching mechanism according to one embodiment.

Referring to FIGS. 9-11, the reset plunger assembly 6 includes a reset plunger 66 with an intermediate collar 78 and an armature 70 that is axially movable along the length of the reset plunger 66. The armature 70 contains a slanted projection feature 71 that is energized by the solenoid 60 through which the armature 70 extends. The slanted projection feature 71 is configured to engage with the latching mechanism, which is structurally supported by the carriage 62 and the set of carriage springs 64. The latching mechanism includes a cam surface 72 coupled to a lifting plate 74. The lifting plate 74 is coupled through a slot 75 in the carriage 62, as shown in FIG. 10. The lifting plate 74 includes a latching portion 80 configured to receive and engage the intermediate collar 78 of the reset plunger 66 during resetting and tripping of the GFCI receptacle 10, as shown in FIG. 11. A return spring 76 is coupled to one end of the lifting plate 74 and is configured to apply a compression force against one side of the carriage 62.

Figure 12A:
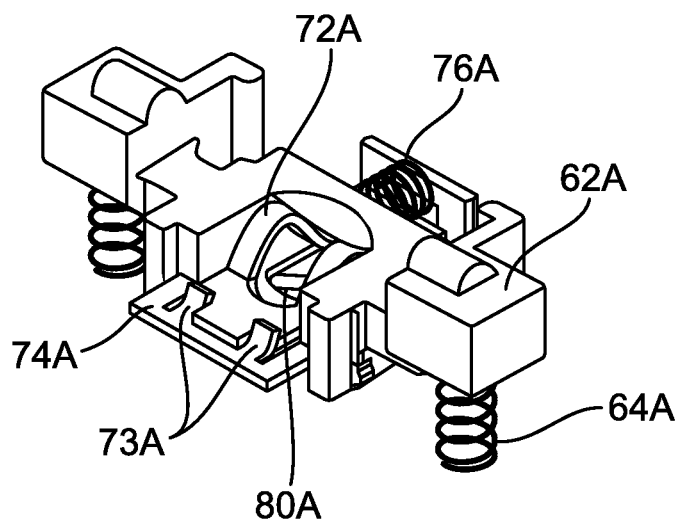
FIG. 12A shows a two-piece latching mechanism design according to one embodiment of the present application.
Figure 12B:
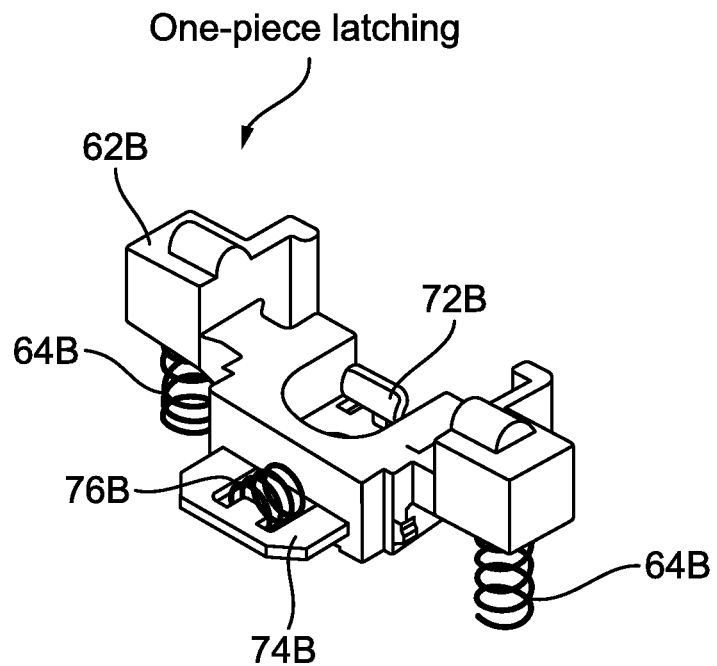
FIGS. 12B-12C show a one-piece latching mechanism design according to one embodiments of the present application.
Figure 12C:
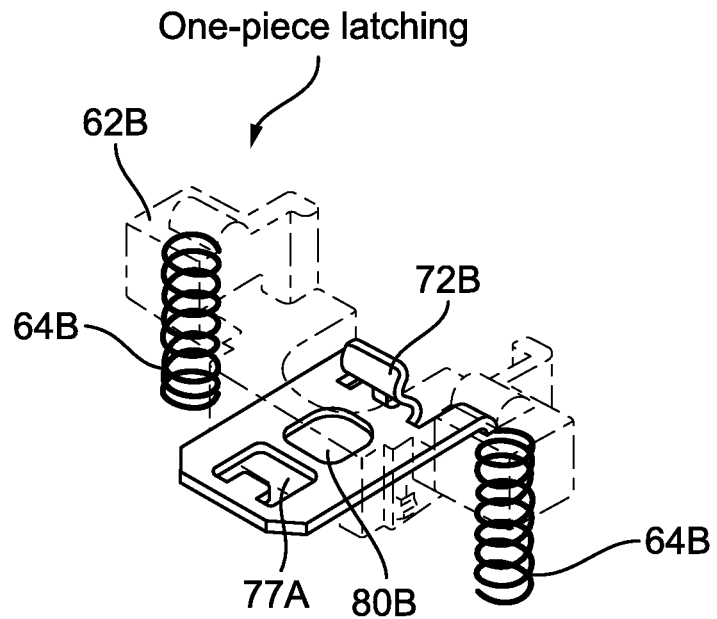

Two exemplary embodiments of the latching mechanism are shown in FIGS. 12A-C. In the two-piece latching mechanism design of FIG. 12A, the cam surface 72A is configured as a separate triangular plate coupled to channels (not enumerated) in the lifting plate 74A. Additionally, a set of tabs 73A at one end of the lifting plate 74A is configured to engage with edges of the cam surface 72A to transfer a translational force from the cam surface 72A to the lifting plate 74A. The return spring 76A is positioned between the other end of the lifting plate 74A and one side of the carriage 62A. The latching portion 80A is configured as the only opening in the lifting plate 74A and receives/engages with the intermediate collar 78.

In the one-piece latching mechanism of FIGS. 12B-C, the cam surface 72B is integrated into the lifting plate 74B as one element. Since the cam surface 72B does not move independent of the lifting plate 74B, coupling mechanism including channels (not enumerated) and tabs 74A are not necessary in the lifting plate 74B. The lifting plate 74B includes an opening 77B and a latching portion 80B. The return spring 76B is situated in the opening 77B and exerts a compression force between edges of the opening 77B and one side of the carriage 62B. The latching portion 80B is configured to receive/engage with the intermediate collar 78. It would be appreciated by those skilled in the art that other design possibilities not detailed herein may serve to achieve essentially the same results and do not deviate from the teachings of the present application.

Figure 13:
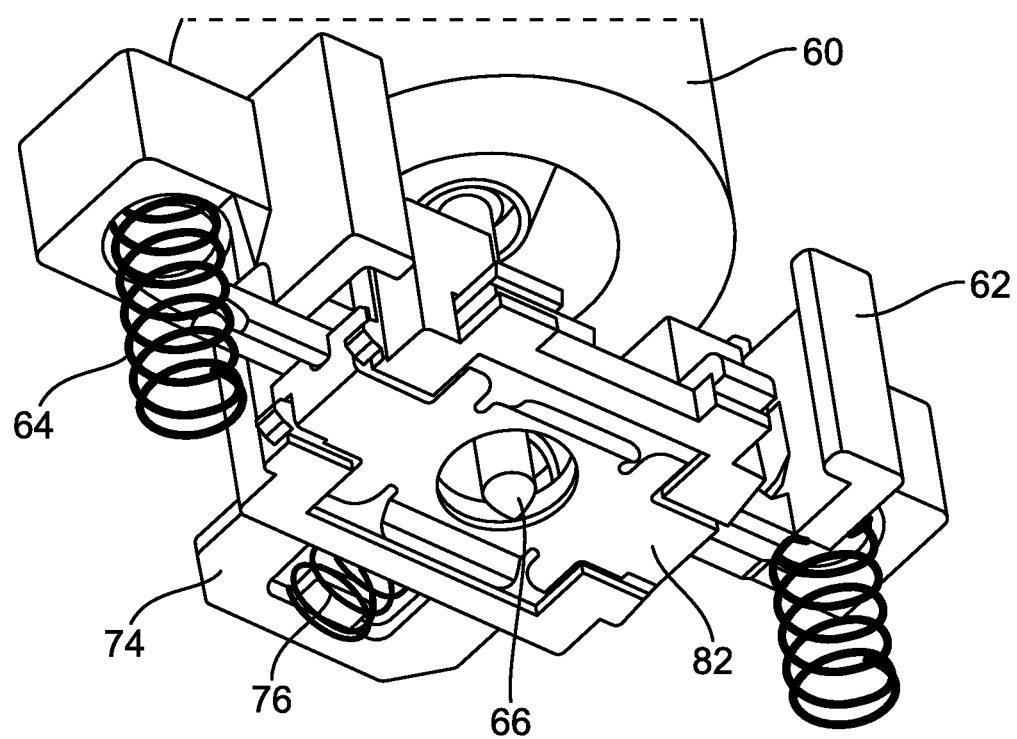
FIG. 13 is a bottom perspective view of the solenoid assembly of FIG. 7.

According to one embodiment shown in FIG. 13, a contact spring 82 is coupled to the bottom of the lifting plate 74. When in an unlatched pushing state as described in further detail below, the contact spring 82 will form electrical communication with at least one contact pads (not shown or enumerated) on the circuit board 58. This electrical communication will provide a communication signal and power from the circuit board 58 to the solenoid 60, thereby energizing the armature 70 and resetting the GFCI receptacle 10.

Figure 14A:
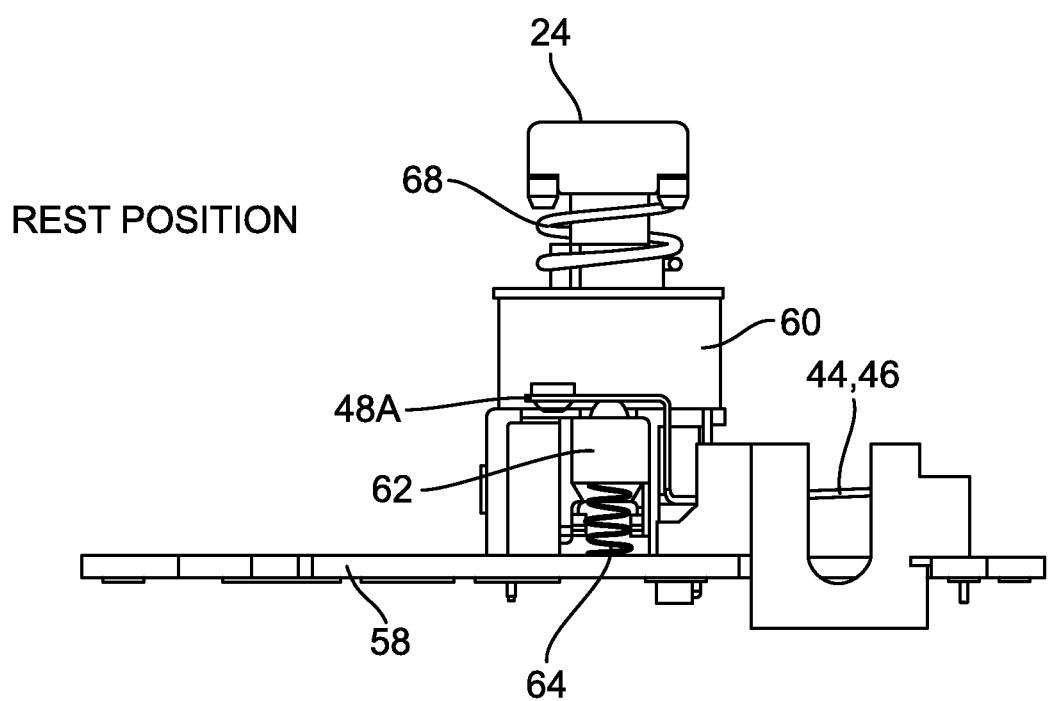
FIG. 14A is a side perspective view of the solenoid assembly in a resting position.
Figure 14B:
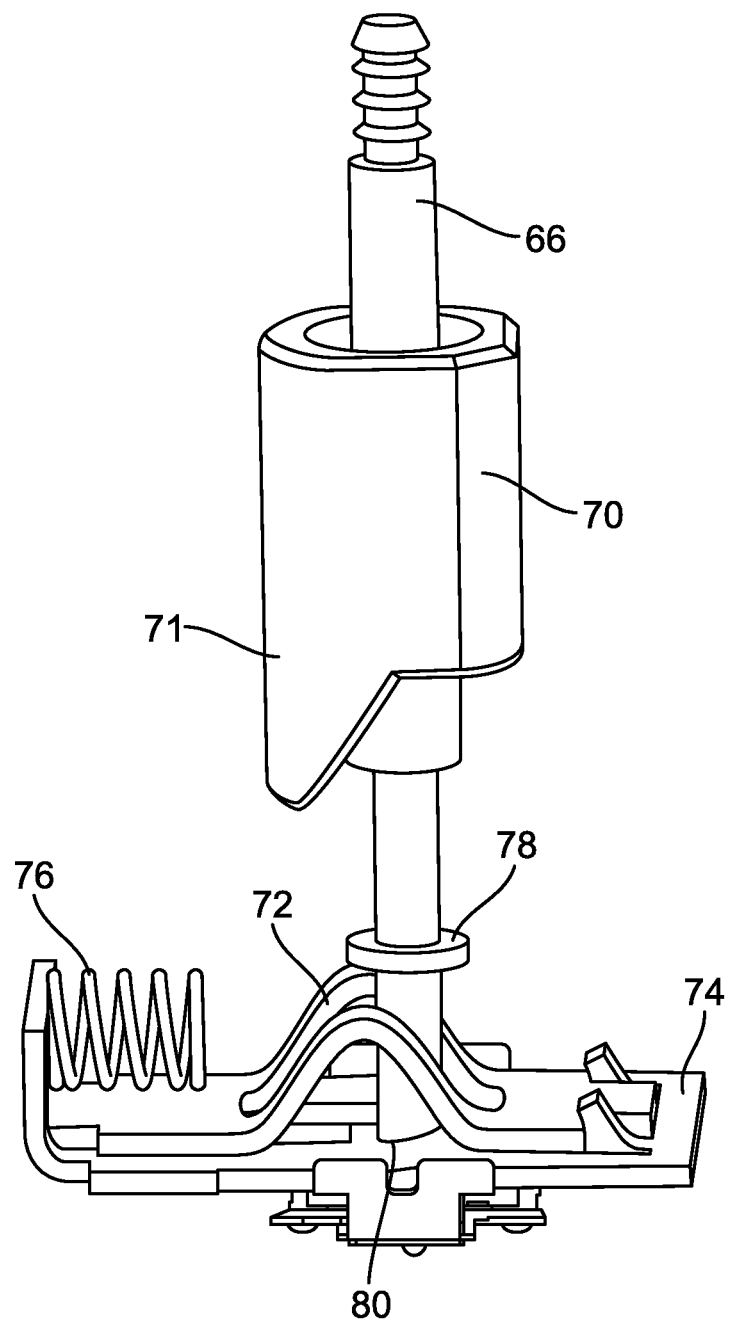
FIG. 14B is a side perspective view of the reset plunger assembly and latching mechanism of the solenoid assembly shown in FIG. 14A.

The GFCI receptacle 10 according to embodiments of the present application has four different states: 1) unlatched state or tripped state, 2) unlatched pushing state, 3) latched pulling state, and 4) latched state or reset state. During the tripped state of FIGS. 14A-B, the carriage 62 is in a resting position biased away from the circuit board 58 via carriage springs 64, so the contact spring 82 (not shown) does not form electrical communication with at least one contact pads (not shown or enumerated) on the circuit board 58. The set of movable contacts 48A does not engage with the set of fixed contacts 48B (not shown), and the receptacle terminals 30, 32, 34 remain biased away from the receptacle openings 16, 18, 20 via cantilevered bus lines 44, 46. Therefore, the solenoid 60 does not receive external power and is not energized, causing the slanted projection feature 71 of the armature 70 to bias away from cam surface 72 (FIG. 14B). There is no compression force in the return spring 76, and the engaging portion 80 of the lifting plate 74 is not aligned to receive the intermediate collar 78 biased away from the lifting plate 74.

Figure 15:
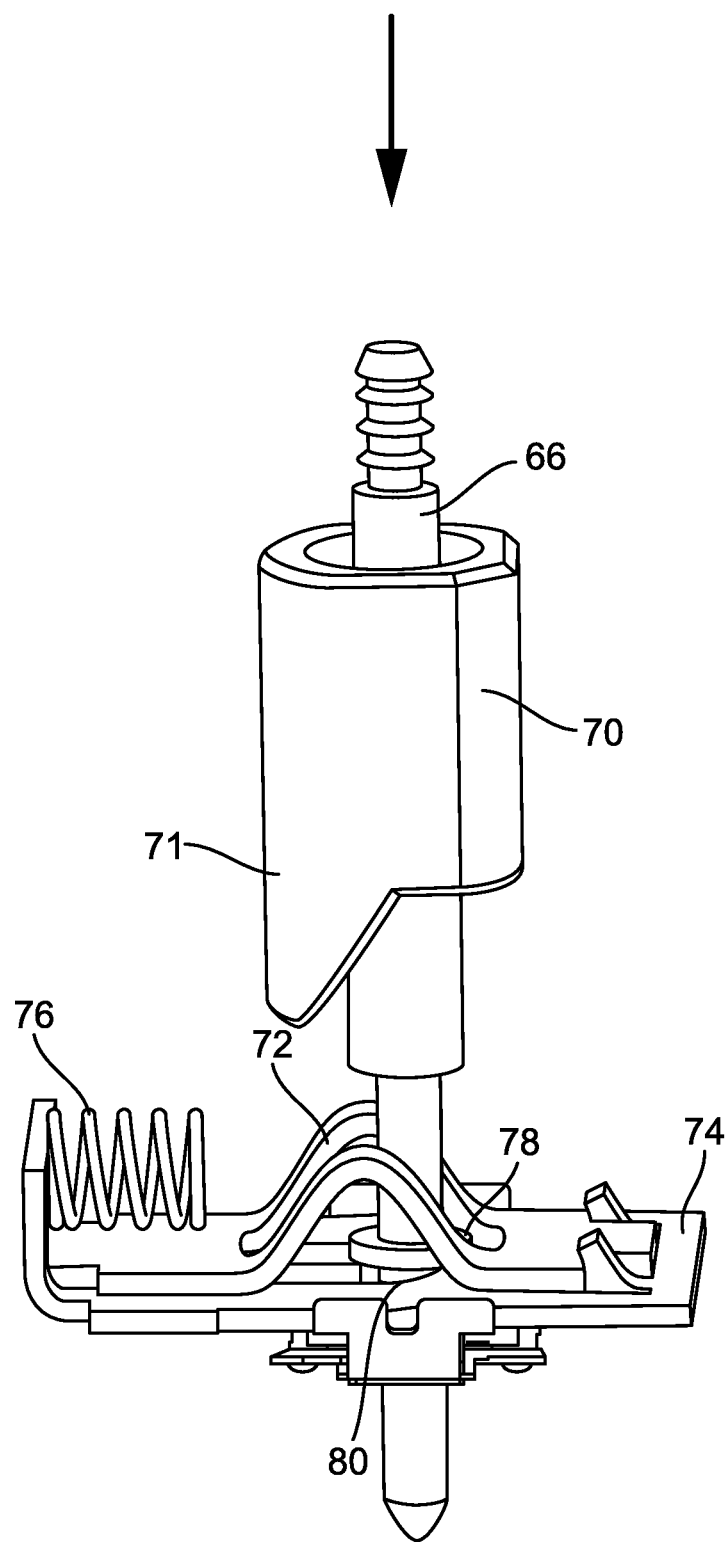
FIGS. 15-18 are side perspective views of the reset plunger assembly and latching mechanism in progressive states during the resetting process.
Figure 16:
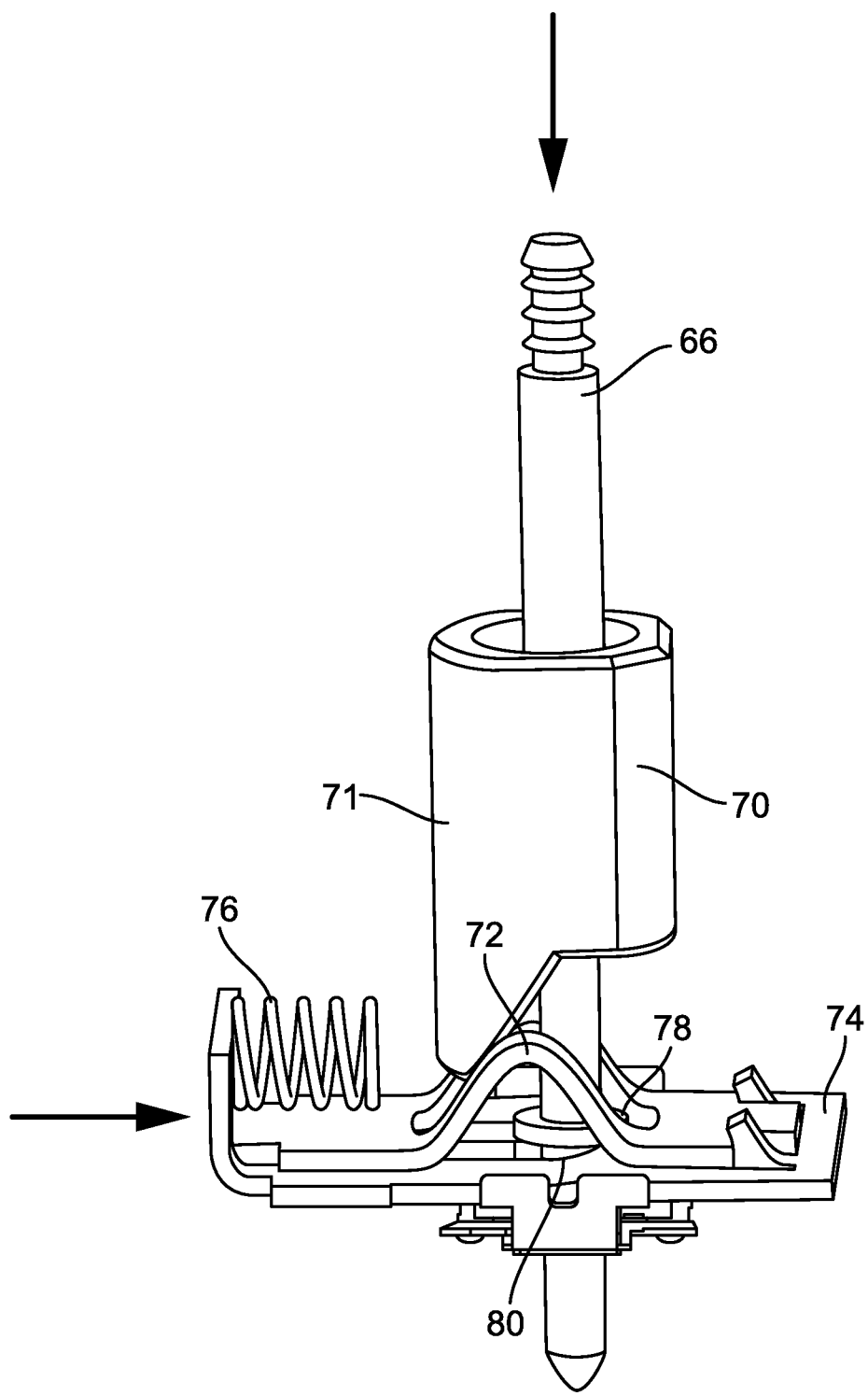
Figure 17:
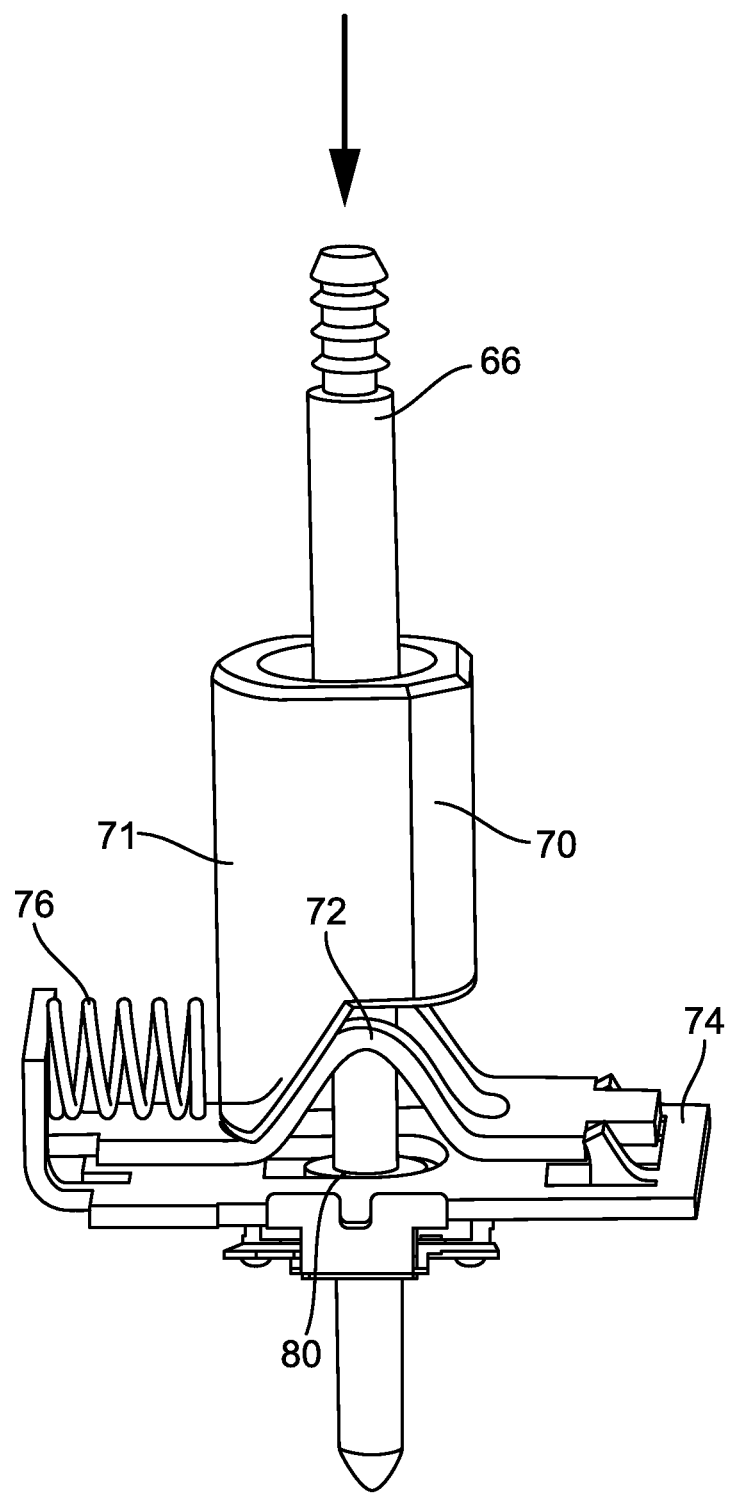
Figure 18:
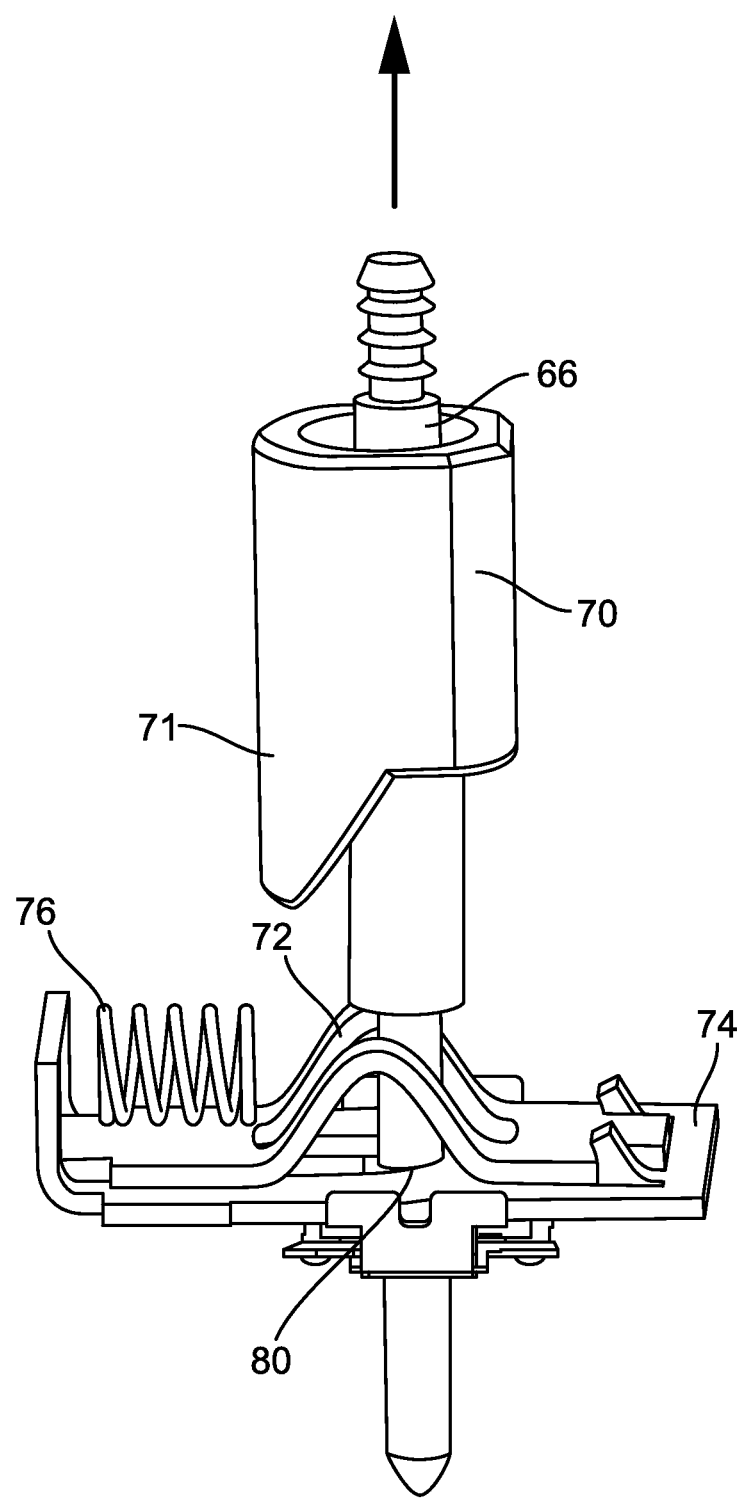

Once a downward pushing force is received on the reset plunger 66 from a user pushing down on the reset button 24, the GFCI receptacle 10 enters the unlatched pushing state of FIG. 15. In the unlatched pushing state, the downward force pushes the reset plunger 66 towards the lifting plate 74 until the intermediate collar 78 engages with an upper surface of the engaging portion 80. Because the engaging portion 80 is misaligned with the intermediate collar 78 from the previous tripped state, the intermediate collar 78 engages with but does not latch to the upper surface of engaging portion 80. Thus, the downward force from the intermediate collar 78 transfers to the engaging portion 80 and the lifting plate 74, which results in downward movement of the carriage 62 via the slot 75 (FIG. 10). This downward movement continues until the contact springs 82 (not shown) form electrical communication with at least one contact pads (not shown or enumerated) on the circuit board 58. Upon contact, electrical power and communication is sent from the circuit board 58 to the solenoid 60, energizing the solenoid on a positive half cycle of the input AC power and moving the armature 70 axially along the reset plunger 66. Referring to FIG. 16, the slanted projection feature 71 of the armature 70 engages with the cam surface 72, which translates the downward force to a translational force parallel to the circuit board 58. Translational movement of the cam surface 72 also translationally moves the coupled lifting plate 74 against the compression force of the return spring 76, thus aligning the engaging portion 80 with the intermediate collar 78. Referring to FIG. 17, the continued downward force on the reset plunger 66 applied by the user causes the intermediate collar 78 to travel through the aligned engaging portion 80. At this point, the solenoid 60 de-energizes on a negative half cycle of the input AC power and retracts axially along the reset plunger 66, as shown in FIG. 18. The compression force of the return spring 76 pushes the side of the carriage 62 and returns the lifting plate 74 and cam surface 72 back to the original position. In this original position, the intermediate collar 78 is once again misaligned with the engaging portion 80. When the user releases the downward pushing force on the reset plunger 66, the reset spring 68 provides an upward pulling force on the reset plunger 66 and intermediate collar 78, thereby latching and locking the intermediate collar 78 to a lower surface of the engaging portion 80. Hence, the GFCI receptacle 10 enters the latched pulling state of the resetting process.

Figure 19:
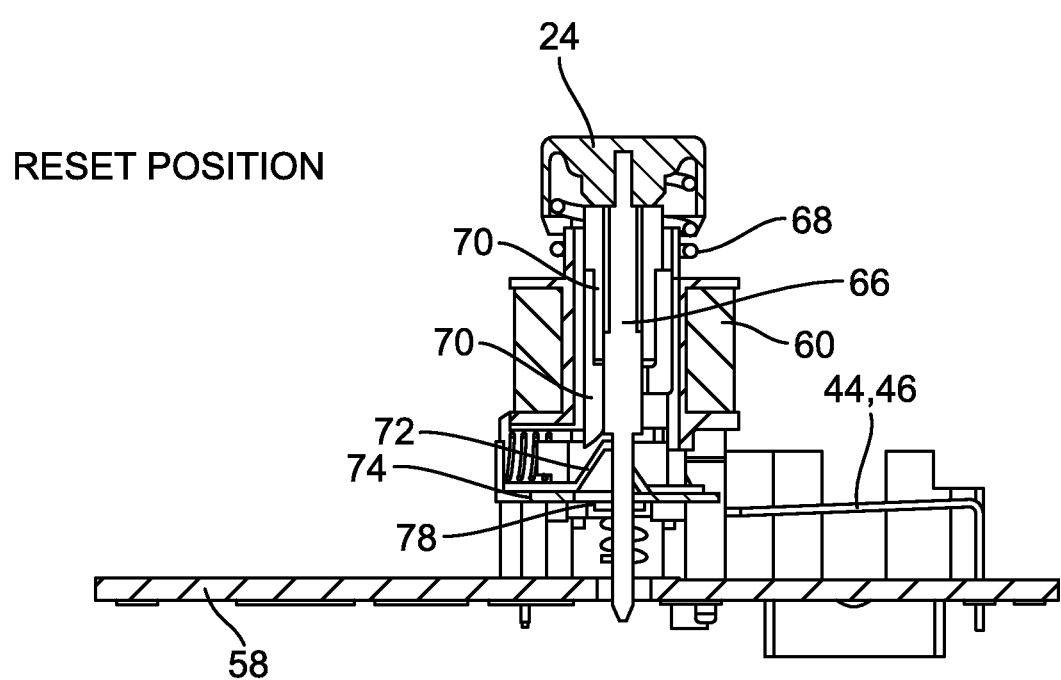
FIG. 19 is a cross-sectional view of the solenoid assembly in a reset position.

When the GFCI receptacle 10 is in the latched pulling state shown in FIG. 19, the compression force of the reset spring 68 creates an upward force on the reset button 24 and the coupled reset plunger 66. This upward force pulls the intermediate collar 78 along with the latched lifting plate 74, which is coupled to the carriage 62 via the slot 75, causing the carriage 62 to move axially upward along the solenoid 60. The axially upward movement of the carriage 62 opposes the resiliency of the abutting set of movable contacts 48A and disconnects the contact springs 82 (not shown) from the at least one contact pads (not shown or enumerated) on the circuit board 58, thus preventing continued energizations of the solenoid 60. The carriage 62 engages with the set of movable contacts 48A to form electrical connection with the set of fixed contacts 48B. Correspondingly, the receptacle terminals 30, 32, 34 also resist the cantilevered bus lines 44, 46 and move closer to the front cover 12. Once electrical communication between the set of movable contacts 48A and the set of fixed contacts 48B is formed, electricity may be delivered from the receptacle terminals 30, 32, 34 to the receptacle openings 16, 18, 20 via the bus lines 44, 46. Hence, the GFCI receptacle 10 is fully reset.

When the sense transformer cores 50, 51 detect the present of a fault, the GFCI receptacle 10 completes a tripping process. During the tripping process, the GFCI receptacle 10 experiences the states of the resetting process in reverse order, thereby unlatching the intermediate collar 78 from the latching portion 80 and breaking the electrical communication between the set of movable contacts 48A and the set of fixed contacts 48B.

Figure 20:
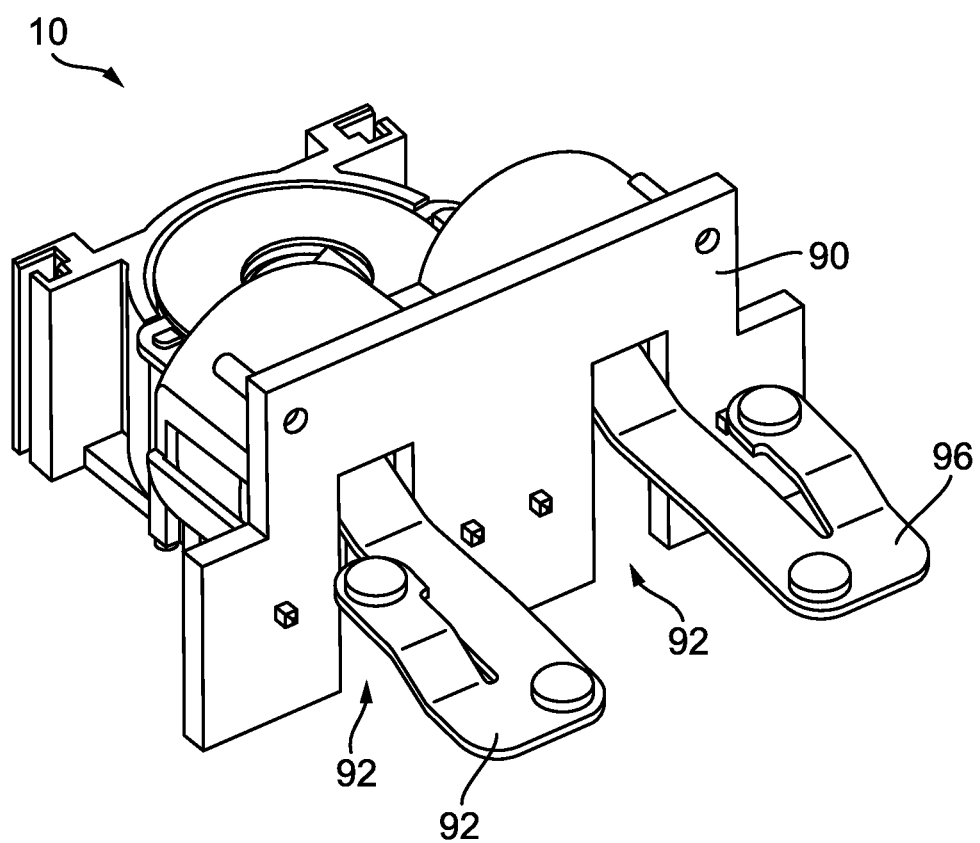
FIG. 20 is a perspective view of a printed circuit board and coils of a receptacle according to some embodiments.
Figure 21:
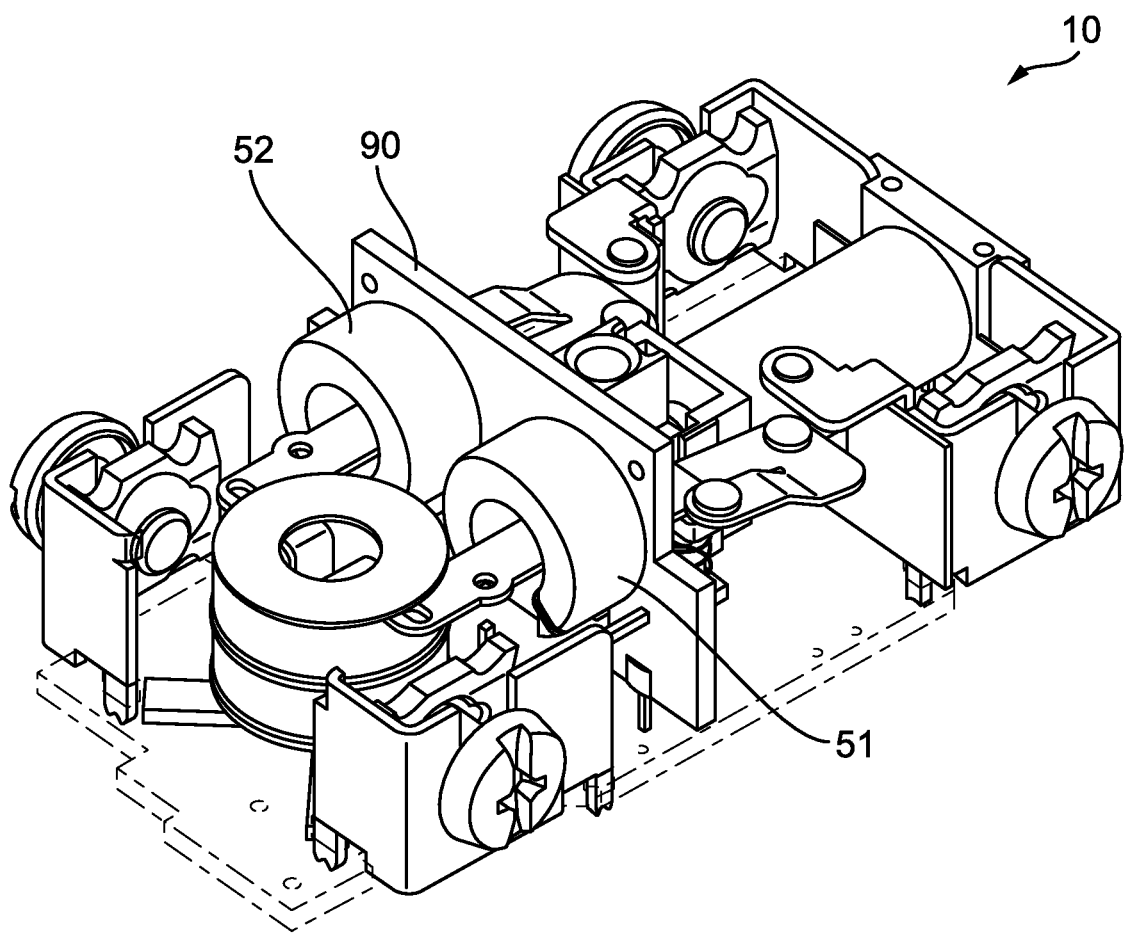
FIG. 21 is a perspective view of the printed circuit board and coils of FIG. 20 coupled to a manifold of a receptacle according to some embodiments.

FIGS. 20 & 21 illustrate a GFCI receptacle 10 according to some embodiments. In the illustrated embodiment, the GFCI receptacle 10 includes a printed circuit board 90. In some embodiments, the printed circuit board 90 includes one or more slots, or apertures, 92. As illustrated, the slots 92 may be configured receive, or be placed over, line conductors 94 and/or the neutral conductors 96, or a portion thereof (for example, bus bars 44, 46). The printed circuit board 90 may further include, or be coupled to, coils (for example, transformer cores 50, 51), which may be used to sense and/or monitor a current. In such an embodiment, the coils may also include a slot, aperture, configured to receive, or be placed over, the line conductors and/or the neutral conductors, or a portion thereof (for example, bus bars 44, 46).

In certain other embodiments, additional elements, such as springs, contacts, etc., may be included in various places within the GFCI receptacle 10 to accomplish resetting or tripping of the device. All combinations of embodiments and variations of design are not exhaustively described in detail herein. Said combinations and variations are understood by those skilled in the art as not deviating from the teachings of the present application.

We claim:

1. An electrical outlet receptacle comprising:
a housing including a face plate;
a plurality of sensing cores each configured to receive a current flow through a center cavity, the current flow defining a current flow direction through the center cavity,
wherein the current flow direction is parallel to the face plate, and wherein the plurality of sensing cores are placed symmetrically in a translational direction across the electrical outlet receptacle.

2. An electrical outlet receptacle comprising:
a housing including a face plate;
a sensing core configured to receive a current flow through a center cavity, the current flow defining a current flow direction through the center cavity,
wherein the current flow direction is parallel to the face plate; and
a solenoid having a central axis perpendicular to the face plate.

3. The electrical outlet receptacle of claim 2, further comprising:
a set of fixed contacts and a set of movable contacts;
the solenoid having a first end and a second end opposite the first end;
a carriage movable axially along the solenoid and configured to interact with the set of movable contacts, the carriage configured to advance the set of movable contacts to form electrical communication with the set of fixed contacts during resetting of the electrical outlet receptacle;
a reset plunger with a portion extending through the first end of the solenoid and axially movable therein, the reset plunger being biased toward a rest position away from the carriage; and
an armature movable axially along the portion of the reset plunger extending through the solenoid, the armature being biased toward a rest position away from the carriage,
wherein the reset plunger includes an engaging portion and the carriage includes a latching portion, the engaging portion of the reset plunger being configured to connect to the latching portion of the carriage.

4. The electrical outlet receptacle of claim 3, wherein the solenoid includes a coil bobbin with an inner coil and an outer coil.

5. The electrical outlet receptacle of claim 3, wherein the reset plunger further includes a spring configured to bias the reset plunger toward the rest position.

6. The electrical outlet receptacle of claim 3, wherein the armature interacts with the latching portion of the carriage when the solenoid is momentarily energized to cause engagement of the engaging portion to the latching portion in a latched state.

7. The electrical outlet receptacle of claim 6, wherein in the latched state, the armature interacts with the latching portion of the carriage when the solenoid is momentarily energized to cause disengagement of the engaging portion from the latching portion in an unlatched state.

8. The electrical outlet receptacle of claim 6, wherein pressing of the reset plunger causes the engaging portion to apply a downward force on the carriage at least until the electrical outlet receptacle is in the latched state, and subsequent release of the reset plunger causes the engaging portion to apply an upward force on the carriage to close the set of movable contacts and the set of fixed contacts.

9. The electrical outlet receptacle of claim 2, wherein the at least one sensing core includes a ground fault circuit interrupter (GFCI) core and an arc fault circuit interrupter (AFCI) core, the GFCI core having a first current flow direction and the AFCI core having a second current flow direction.

10. The electrical outlet receptacle of claim 9, wherein the first current flow direction and the second current flow direction are identical to each other.

11. The electrical outlet receptacle of claim 9, wherein the first current flow direction and the second current flow direction are substantially parallel to each other.

12. The electrical outlet receptacle of claim 9, wherein the first current flow direction and the second current flow direction are at an oblique angle to each other.

13. The electrical outlet receptacle of claim 9, wherein the first current flow direction and the second current flow direction are at a right angle to each other.

14. The electrical outlet receptacle of claim 9, wherein the GFCI core and AFCI core are positioned in a symmetrical placement across a translational direction of the electrical outlet receptacle, the symmetrical placement allowing for no interference of the GFCI core and the AFCI core with contact terminals connectable to an external device.

* * * * *